US010908239B1

(12) United States Patent
Zens

(10) Patent No.: US 10,908,239 B1
(45) Date of Patent: Feb. 2, 2021

(54) BROAD BAND INDUCTIVE MATCHING OF A NUCLEAR MAGNETIC RESONANCE CIRCUIT USING INDUCTIVE COUPLING

(71) Applicant: JEOL LTD., Tokyo (JP)

(72) Inventor: Albert Zens, Peabody, MA (US)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/848,548

(22) Filed: Apr. 14, 2020

(51) Int. Cl.
*G01R 33/36* (2006.01)
*G01R 33/44* (2006.01)
*H03H 7/38* (2006.01)

(52) U.S. Cl.
CPC ..... *G01R 33/3635* (2013.01); *G01R 33/3607* (2013.01); *G01R 33/446* (2013.01); *H03H 7/38* (2013.01)

(58) Field of Classification Search
CPC .............. G01R 33/3635; G01R 33/446; G01R 33/3607; G01R 33/3642; H03H 7/38
See application file for complete search history.

(56) References Cited

U.S. PATENT DOCUMENTS

| 3,789,832 A | 2/1974 | Damadian |
| 4,301,410 A | 11/1981 | Wind |

(Continued)

FOREIGN PATENT DOCUMENTS

| JP | 2008154933 A | 12/2006 |
| WO | WO2010/018535 | 2/2010 |

(Continued)

OTHER PUBLICATIONS

Bowyer, P. et al., "Using magnetic 1-25 coupling to implement 1H,19F,13C experiments in routine high resolution NMR probes", Journal Magnetic Resonance, vol. 261, (2015), pp. 190-198.

(Continued)

*Primary Examiner* — Rishi R Patel
(74) *Attorney, Agent, or Firm* — Sci-Law Strategies, PC

(57) ABSTRACT

In a first aspect, the present invention relates to a Nuclear Magnetic Resonance (NMR) probe and method of use of a NMR probe for matching a resonant mode in a circuit to a required impedance (e.g., Z=50 Ohm) using a variable inductor which allows matching of the resonant mode in the circuit within a broad frequency range. In an additional aspect, the NMR probe and the method of use of a NMR probe allows matching of a resonant mode in a circuit to a required impedance (e.g., Z=50 Ohm) using a variable inductor without requiring the coupling constant K to be varied over a broad frequency range. In a further aspect, the invention relates to a method to detect a Nuclear NMR mode of a nuclei including the steps of introducing a sample into a NMR probe comprising a primary circuit and a secondary circuit, where the primary circuit comprises a sample coil, a first variable capacitor and a RF pulse generator, where the secondary circuit comprises a coupling loop, a variable inductor and an impedance port, introducing the NMR probe into a magnetic field, exciting the sample with the RF pulse generator, inductively coupling the coupling loop to the sample coil, adjusting the first variable capacitor and the variable inductor to match the impedance to the required impedance of the impedance port and detecting a NMR mode of a nuclei of the sample.

20 Claims, 19 Drawing Sheets

(56) References Cited

U.S. PATENT DOCUMENTS

| | | | |
|---|---|---|---|
| 4,398,149 | A | 8/1983 | Zens |
| 4,517,516 | A | 5/1985 | Hill |
| 4,549,136 | A | 10/1985 | Zens |
| 4,609,872 | A | 9/1986 | O'Donnell |
| 4,654,592 | A | 3/1987 | Zens |
| 4,654,593 | A | 3/1987 | Ackerman |
| 4,751,465 | A | 6/1988 | Zens |
| 4,833,412 | A | 5/1989 | Zens |
| 4,947,120 | A | 8/1990 | Frank |
| H1218 | H | 8/1993 | Cory |
| 5,243,289 | A | 9/1993 | Blum |
| 5,483,163 | A | 1/1996 | Wen |
| 7,088,102 | B1 | 8/2006 | Zens |
| 7,106,063 | B1 | 9/2006 | Zens |
| 7,352,185 | B1 | 4/2008 | Zens |
| 7,557,578 | B1 | 7/2009 | Zens |
| 7,570,059 | B2 | 8/2009 | Greim |
| 8,063,639 | B2 | 11/2011 | Zens |
| 1,024,106 | A1 | 11/2018 | Zens |
| 1,024,116 | A1 | 3/2019 | Zens |
| 2001/0033165 | A1 | 10/2001 | Tomanek |
| 2009/0256569 | A1 | 10/2009 | Hancu |
| 2010/0156414 | A1* | 6/2010 | Sakellariou .......... G01R 33/307 324/309 |
| 2010/0164645 | A1* | 7/2010 | Kobayashi .............. H03F 1/565 333/32 |
| 2011/0025326 | A1 | 2/2011 | Zens |
| 2014/0057792 | A1 | 2/2014 | Brey |
| 2018/0267118 | A1* | 9/2018 | Zens .................. G01R 33/3635 |

FOREIGN PATENT DOCUMENTS

| | | |
|---|---|---|
| WO | WO2013/108142 | 7/2013 |
| WO | WO2016179523 | 5/2016 |

OTHER PUBLICATIONS

Hoult, D.I., et al., "Use of Mutually Inductive Coupling in Probe Design", Concepts in Magnetic Resonance (Magnetic Resonance Engineering), vol. 15, (2002), pp. 262-285.

Kuhns PL et al., "Inductive coupling and tuning in NMR probes; Applications", Journal Magnetic Resonance, vol. 78, (1988), pp. 69-76.

Taber, B. Using Magnetic Coupling to Improve the 1H/2H Double Tuned Circuit, J. Magn. Reson. 259 (2015) 114-120.

Tang, J.A. et al., Practical aspects of liquid-state NMR with inductively coupled solenoid coils, Magnetic Resonance in Chemistry, Jul. 27, 2010, (wileyonlinelibrary.com) DOI 10.1002/mrc.2651.

Van Hecke P, et al., "Double-Tuned Resonator Designs for NMR Spectroscopy", Journal Magnetic Resonance, vol. 84, (1989), pp. 170-176.

International Search Report, PCT/IB2016/000730, dated Nov. 11, 2016, 15 pages.

International Search Report, PCT/JP2017/000178, dated Oct. 17, 2017, 11 pages.

EPO Examination Report 16731648.8, regional phase in Europe of PCT/IB2016/000730, dated Apr. 24, 2018, 8 pages.

EPO Communication Art 94(3) EPC for Application No. 16731648. 8, dated Nov. 15, 2018, 10 pages.

EPO Communication Art 94(3) EPC for Application No. 17719932. 0, dated Jan. 14, 2019, 8 pages.

EPO Communication Art 94(3) EPC for Application No. 17719932. 0, dated Jul. 1, 2020, 6 pages.

Japanese Office Action for Application No. 2017-553891, dated Oct. 9, 2018, 4 pages.

English translation of Japanese Office Action for Application No. 2017-553891, dated Oct. 9, 2018, 3 pages.

Japanese Office Action for Application No. 2018-526823, dated Mar. 11, 2019, 4 pages.

English translation of Japanese Office Action for Application No. 2018-526823, dated Mar. 11, 2019, 2 pages.

Chinese Office Action for Application No. 201680034553.6, dated Jul. 2, 2019, 7 pages.

English translation of Chinese Office Action for Application No. 201680034553.6, dated Jul. 2, 2019, 3 pages.

Chinese Office Action for Application No. 201680034553.6, dated Jun. 3, 2020, 7 pages.

English translation of Chinese Office Action for Application No. 201680034553.6, dated Jun. 3, 2020, 4 pages.

Chinese Office Action for Application No. 2017800041535.5, dated Nov. 25, 2019, 6 pages.

English translation of Chinese Office Action for Application No. 2017800041535.5, dated Nov. 25, 2019, 3 pages.

Chinese Office Action for Application No. 2017800041535.5, dated Jun. 22, 2020, 6 pages.

English translation of Chinese Office Action for Application No. 2017800041535.5, dated Jun. 22, 2020, 4 pages.

* cited by examiner

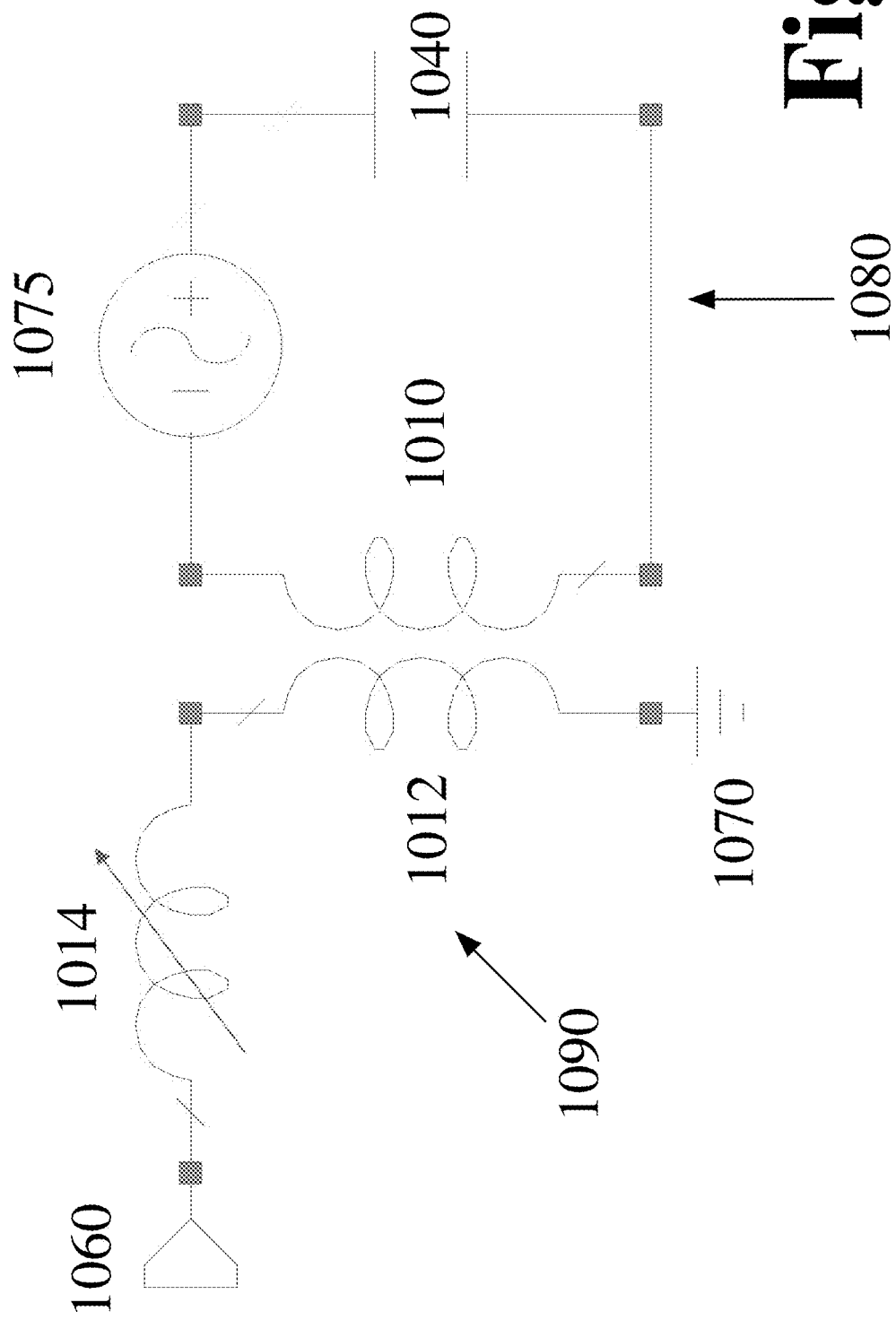

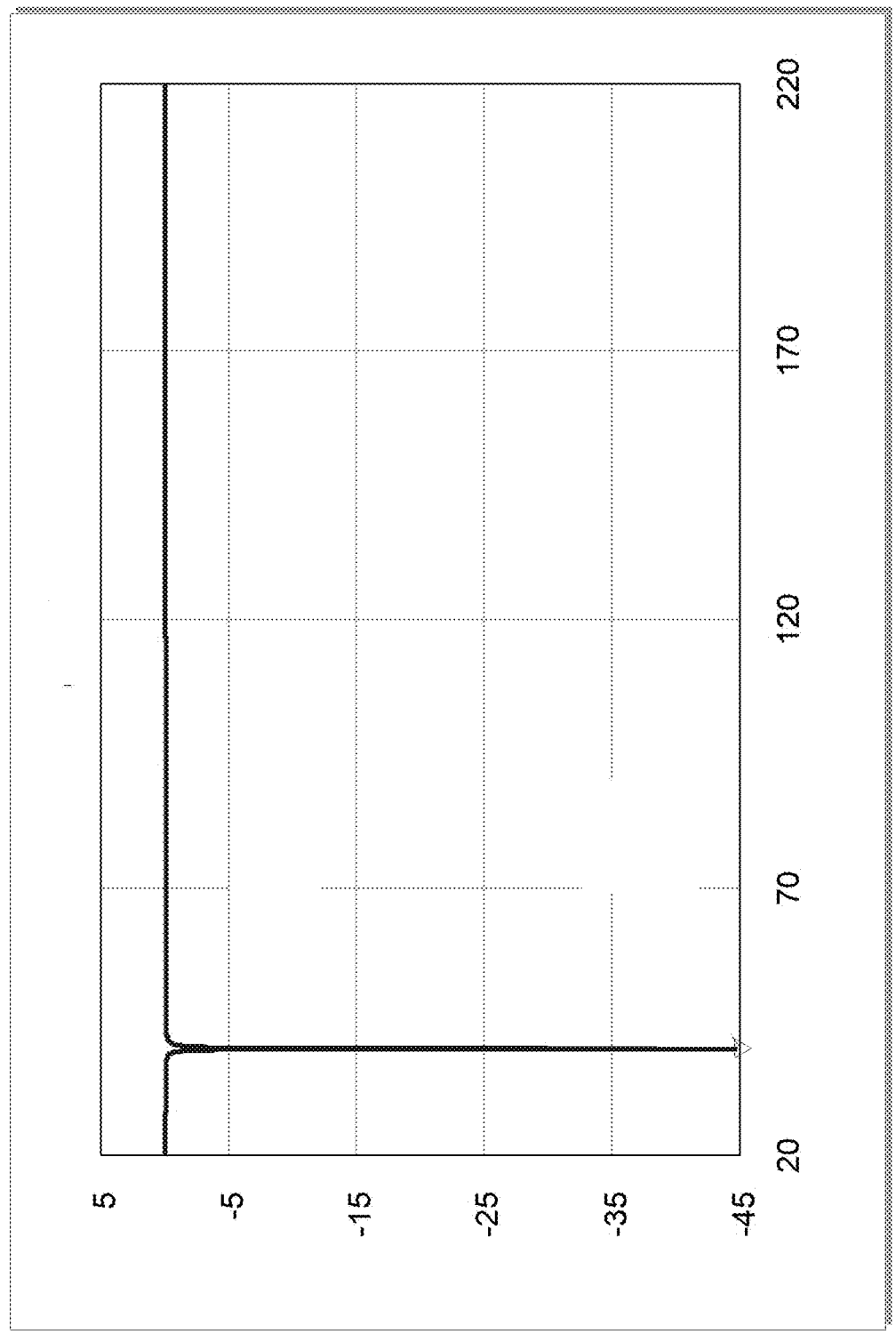

BROAD BAND INDUCTIVE MATCHING OF A NUCLEAR MAGNETIC RESONANCE CIRCUIT USING INDUCTIVE COUPLING

FIELD OF THE INVENTION

The present invention relates to a Nuclear Magnetic Resonance (NMR) probe and methods of use for matching a resonant mode in a circuit to a required impedance (e.g., Z=50 Ohm) using a variable inductor which allows matching of the resonant mode in the circuit within a broad frequency range.

BACKGROUND OF THE INVENTION

Structural elucidation of a compound, whether a synthesis product or an extract from a natural source generally requires the application of a number of analytical techniques. In this context, infrared spectroscopy, mass spectrometry, and nuclear magnetic resonance (NMR) spectroscopy can provide extensive chemical information. In particular, NMR spectroscopy can provide structural information and also information on both intermolecular and intramolecular dynamics. Applications of NMR spectroscopy range from determination of three-dimensional structures of large proteins to the analysis of very small amounts of products from combinatorial syntheses. Furthermore, NMR is a nondestructive analytical method.

An NMR probe includes a volume in which a sample can be loaded (i.e., a conventional NMR probe tube as known in the art) and one or more circuits for providing RF energy to the sample. NMR probes typically have an inner coil for irradiation and detection of a first nuclear species, and a second coil co-axial with the inner coil for irradiation and or detection of one or more other nuclear species of the sample. The two coils can be oriented 90 with respect to each other to minimize coupling between the two coils. Unless magnetic coupling is intended, and the two coil don't resonate near the same frequency, the inductors in the probe circuits optimally have minimal coupling (k is less than approximately 0.03) between them in order to reduce or eliminate cross talk between these elements. Because signal to noise ratios are typically low in multi nuclear NMR experiments, it is critical to maximize the signal to noise ratio during the measurement. For magnetic coupling in this range, approximately means plus or minus ten (10) percent. Capacitive coupling can be used to form multiply-tuned NMR probes for example, $^1H$-$^2H$, $^{13}C$-$^{15}N$ and $^1H$-$^{19}F$. It has been shown by Zens in U.S. Pat. No. 10,241,063 entitled "Magnetic Coupling High Resolution Nuclear Magnetic Resolution Probe and Method of Use", issued Mar. 26, 2019, which is explicitly incorporated by reference in its entirety and for all purposes, that magnetic coupling can also be used to measure multiple resonance circuits. More recently it has been shown by Zens in U.S. Pat. No. 10,241,165 entitled "Inductive Coupling in Multiple Resonance Circuits in a Nuclear Magnetic Resonance Probe and Methods of Use", issued Mar. 26, 2019, which is explicitly incorporated by reference in its entirety and for all purposes, that coupling coils and resonators can be coupled to a coupling loop rather than to the sample coil in order to improve the space utilization within the probe, the RF homogeneity of the sample coil, and the signal to noise of the circuit.

In NMR spectroscopy, the efficiency of a circuit is very important because the technique is challenged by low signal intensity. The situation manifests itself in terms of low signal to noise ratios for the detected signals. Over the last seventy five years a major focus of NMR advances has been to improve the NMR detection capability.

SUMMARY OF INVENTION

In a first aspect, the present invention relates to a NMR probe for matching a resonant mode in a circuit to a required impedance (e.g., Z=50 Ohm) using a variable inductor which allows matching of the resonant mode in the circuit within a broad frequency range. In an additional aspect, the NMR probe allows matching of a resonant mode in a circuit to a required impedance (e.g., Z=50 Ohm) using a variable inductor without requiring the coupling constant K to be varied over a broad frequency range.

In a further aspect, the invention relates to a method of use of a NMR probe for matching a resonant mode in a circuit to a required impedance (e.g., Z=50 Ohm) using a variable inductor which allows matching of the resonant mode in the circuit within a broad frequency range. In a further additional aspect, the method of use of a NMR probe allows matching of a resonant mode in a circuit to a required impedance (e.g., Z=50 Ohm) using a variable inductor without requiring the coupling constant K to be varied over a broad frequency range.

In an additional aspect, the invention relates to a method to detect a Nuclear NMR mode including introducing a sample into a NMR probe comprising a primary circuit (1080) and a secondary circuit (1090), where the primary circuit (1080) comprises a sample coil (1010), a Radio Frequency (RF) pulse generator (1075), and a first variable capacitor (1040), where the secondary circuit (1090) comprises a coupling loop (1012), a variable inductor (1014) and an impedance port (1060), introducing the NMR probe into a magnetic field, exciting the sample with the Radio Frequency (RF) pulse generator (1075), inductively coupling the coupling loop (1012) to the sample coil (1010), adjusting the first variable capacitor (1040) and the variable inductor (1014) to match impedance of the impedance port (1060) to fifty(50) Ohm and detecting a NMR mode of one or more nuclei of the sample.

BRIEF DESCRIPTION OF THE DRAWINGS

This invention is described with respect to specific embodiments thereof. Additional features can be appreciated from the Figures in which:

FIG. 4 shows inductive coupling for a LC circuit in which the circuit is matched to 50 Ohm of impedance port 1060 by iterating $C_1$ 1040 and $L_3$ 1014, according to an embodiment of the present invention;

FIG. 6A shows the resonance dB(|S(1,1)|) plot for a primary inductor shown in FIG. 3 tuned and matched to 40 MHz;

DETAILED DESCRIPTION OF THE INVENTION

Definitions

Figure 1:
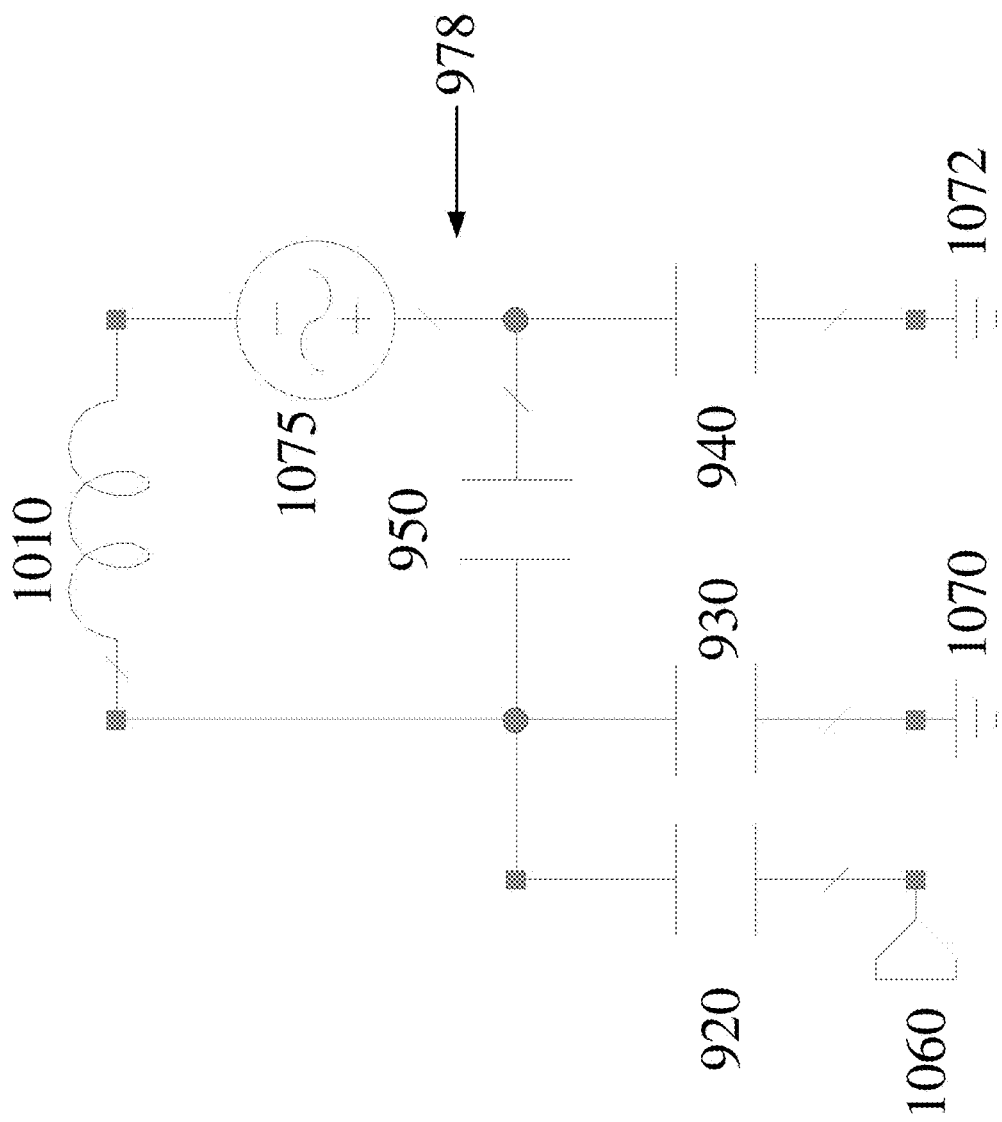
FIG. 1 shows a capacitive matching circuit, as known in the literature.

The transitional term 'comprising' is synonymous with 'including', 'containing', or 'characterized by', is inclusive or open-ended and does not exclude additional, unrecited elements or method steps.

The transitional phrase 'consisting of' excludes any element, step, or ingredient not specified in the claim, but does not exclude additional components or steps that are unrelated to the invention such as impurities ordinarily associated with a composition.

The transitional phrase 'consisting essentially of' limits the scope of a claim to the specified materials or steps and those that do not materially affect the basic and novel characteristic(s) of the claimed invention.

Coupling to various coils of different sizes and functions can be used to optimize the circuit. A sample coil, a coupling coil, a lock coil, a splitting coil and a detector coil can be Helmholtz coils. A sample coil, a coupling coil, a lock coil, a splitting resonator and a detector coil can be a solenoid coil.

The word 'mode' means a resonance in the circuit. The number of modes in a circuit cannot exceed the number of inductors.

The phrases 'primary coil', 'primary inductor', 'sample coil' or 'sample inductor' mean the inductor used to observe the sample resonance.

The phrase 'sample resonator' refers to an inductive coil and capacitor. A sample resonator can be used for detecting the fluctuating signal that is in resonance with a signal from a sample. In circumstances where there is no lower threshold, a first distance is defined between the sample resonator and the one or more inductive coupling loops. A resonant circuit is an electric circuit which has oscillating currents which are stored as energy and the impedance of the capacitor and inductor are near zero. The only losses in the circuit are from the pure resistive parts of the components, the inductor L and the capacitor C. Inductive coupling is the near field wireless transmission of electrical energy between two magnetically coupled coils.

A splitting resonator can be used to split a signal. The splitting resonator can be used to split the primary resonance into at least two signals. The splitting resonator can be used to split for example $^{13}C/^{27}Al$, $^{1}H/^{19}F$, $^{27}Al/^{65}Cu$, $^{17}O/^{63}Cu$, and $^{63}Cu/^{65}Cu$.

The word 'susceptibility' refers to the magnetic susceptibility of the materials used to construct the probe to preserve the $B_0$ homogeneity of the magnet in the sample region. Here "Zero Susceptibility" means very low volume susceptibility.

The phrase 'multiply tuned resonance circuit' means two (2) or more resonant modes in the circuit. In an embodiment of the invention, a triply tuned circuit consists of for example $^{13}C$, $^{2}H$ and $^{15}N$ tuned circuits. In an alternative embodiment of the invention, a triply tuned circuit consists of for example $^{13}C$, $^{1}H$ and $^{15}N$ tuned circuit.

The phrase 'lower insulator' means a partition between the region that houses the primary circuit (sample coil) and the area outside of the sample coil region. If present, tertiary coils which form neither primary nor secondary circuits, can be located in the same region as the primary circuit. The secondary circuits are located outside the sample coil region. In various embodiments of the invention, some NMR probes, i.e. solids probes, do not use a formal lower insulator partition.

The phrase 'Circuit Fill Factor (CFF)' in the context of a specific mode 'm' means that the definition of CFF is referred to a reference inductor, $$CFF_{m,a} = \frac{L_a i_a^2}{\sum_{j=1}^{N} L_j i_j^2},$$

where i is the current in the inductor, the j indices identify specific inductors, and it is implicit that the current values are for the $m^{th}$ mode. It is clear that this definition does not accommodate the presence of mutual inductance. From the definition of CFF it is clear that having more inductors in the circuit dilutes the S/N of the multiply tuned probe circuit. For probe circuits with multiple ground points there exist the question of what is the common ground point. If the ground points are not at the same potential as the common ground point then each ground point is essentially an inductor to that common ground point and hence has the potential to dilute the CFF of the circuit.

The Quality Factor (Q) is defined as the time averaged ratio of the energy stored in a component to the energy dissipated by the component. The unloaded Q ($Q_u$) is the measured Q without the load.

The phrase a 'symmetrical circuit' refers to the topological symmetry of a primary circuit having a sample (primary) coil and a 'mirrored arrangement' of all inductive components with the exception of the sample coil. The phrase 'mirrored arrangement' means a primary circuit which has a plane of reflection (out of a two dimensional plane of the circuit), that splits components equally either side of the plane of reflection and passes midway through the sample coil. The mirrored arrangement does not extend to a secondary circuit which is not electrically connected to the primary circuit (i.e., a secondary circuit which is inductively coupled to the sample coil, or a secondary circuit which is inductively coupled to secondary inductor coils present in the primary circuit). A person of ordinary skill would understand that a circuit is symmetrical if it can be drawn to show a mirrored arrangement. As a consequence, a symmetrical circuit would have an even number of secondary inductor coils because each secondary inductor coil on one side of the plane of reflection would have a corresponding secondary inductor coil on the other side of the plane of reflection. For a circuit with a sample coil, half of the secondary inductor coils are electrically connected closest to point A (connected to one side of the sample coil) and the other half of the secondary inductor coils are electrically connected closest to point B (connected to the other side of the sample coil).

The phrase 'electrically connected' means connected through a conducting path as distinguished from connected through electromagnetic thru space induction.

The words or phrases 'coupling', 'coupling modes', 'detecting' or 'detecting modes' mean matching the resonant mode in a circuit such that the critical coupling constant is minimized and thereby the signal to noise is maximized. The critical coupling is necessary for matching the resistance to a specific impedance. In an embodiment of the invention, the resistance can be matched to a fifty (50) Ohm coaxial cable. It is understood by one of ordinary skill in the art that wide band matching circuits envisioned herein can be matched to a specific impedance, e.g., fifty (50) Ohm. In various embodiments of the invention, the resistance can be matched to other resistance coaxial cable. In an embodiment of the invention, the resistance can be coupled to seventy five (75) Ohm coaxial cable. In various embodiments of the invention, seventy seven (77) Ohm coaxial cable gives minimum loss. Unless indicated otherwise, wide band matching circuits discussed herein assume fifty (50) Ohm output impedance. However, different input impedances are available and envisioned by proper choice of the individual components in the circuit provided herewith. The phrase the 'coupling loop' or 'inductive coupling loop' means an inductive coupling coil used to match a resonance mode of a circuit to a required impedance, e.g., fifty (50) Ohm, as obtained e.g., with a 50 Ohm coaxial cable.

NMR generally uses induction to detect the oscillating magnetic moment from nuclei precessing in a magnetic field. Because the signal from these precessing nuclei is inherently weak research efforts have been focused on improving the signal to noise ratio obtained in NMR experiments. There are two general ways to increase the signal to noise ratio. One way is to increase the size of the magnetic moment by induced polarization. The other way is to decrease the noise by cooling the coils and electronics used to detect the signal. In the last 20 years cooling the coils has been the major focus of the research. For example, to provide improved sensitivity the electronics for signal detection can be cryo-cooled. In contrast, the signal to noise of the RF homogeneity of the sample coil can be degraded by magnetic coupling to the coil with even small K (coupling constant) values.

An NMR probe includes a complex array of field shimming or field improving devices to correct for magnetic field inhomogeneities. The probe can be a removable cylinder which contains: the sample tube holder and air spinner outlets; the radiofrequency coils for signal detection, spin irradiation, and locking of the magnetic field; the electronics, Dewar, gas inlets and outlets for cooling and heating of the sample; tuning coils for fine adjustments of the magnetic field, and coils for producing precise field gradients. For the most common nuclei, the magnetic moments are: $^1$H $\mu$=2.7927, $^2$H $\mu$=0.8574, $^{19}$F $\mu$=2.6273, $^{31}$P $\mu$=1.1305 & $^{13}$C $\mu$=0.7022. These moments are in nuclear magnetons, which are 5.05078×10-27 JT. The energy difference between two spin states is less than 0.1 cal/mole. The spins in the NMR experiment are detected by a resonator which in all cases detects the fluctuating signal with a circuit that is in resonance with the signal from the sample. That is, the circuit contains an inductor and capacitor which resonates at the Larmor (resonance frequency) frequency of the spins in the sample. The inductor usually encloses the NMR sample in a manner which closely approximates the sample volume. The signal from the resonator must be matched to a transmission line so that the excitation and detection of the signal can be accomplished with minimal loss. NMR Resonators can be designed in many shapes and forms. From simple solenoids to complex built in capacitance coil arrays. Often more than one spin type or nucleus is excited or detected during the course of an experiment. Multiple coils are used to accomplish this and the region around the sample can become space intensive in terms of the number of objects required to undertake the signal detection in the NMR experiment. Due to space considerations the sample coil surrounding the sample is often resonated such that it has multiple modes. However, the number of modes cannot exceed the number of inductors. The practice of employing multiple resonating sample coils helps reduce the number of resonators in the sample region of the NMR probe.

An NMR probe can include a sample, a sample detection coil(s) and associated circuitry, a support for the sample detection coil(s), a pulsed field gradient, a shield, one or more coupling coils and associated circuitry, supports for the one or more coupling coils and inductors, capacitors and variable capacitors.

An NMR probe can have three channels, an x-channel for observing a nuclei frequency (chosen from various nuclei frequencies), a second channel for decoupling nuclei and a third lock channel (for example, for stabilization of the system). The x-channel can be required to vary from a frequency of for example 40 MHz in a 400 MHz magnet NMR, up to $^{15}$N, for example 245 MHz for $^{31}$P in a 600 MHz magnet NMR. This typically requires a lot of capacitance variance on the tune part and the match part of the x-channel. In some circuits additional capacitance must be switched in to allow the matching to occur. The sample inductance which is typically approximately 250 nH plus or minus ten percent must be matched over this frequency range (i.e., 40-250 MHz).

For NMR circuits there have are two general methods of matching NMR circuits as outlined by D. D. Traficante, "Impedance: What it is and Why it Must be Matched. Concepts in Magnetic Resonance", (1989) 1, 73-92. The first method uses capacitive coupling of the circuit 978 to 50 Ohm of the impedance port 1060. FIG. 1 shows a general circuit 978 of this type, with a sample coil 1010, an impedance port 1060, a power supply 1075, capacitors 920, 930, 940, and 950, and ground points 1070, 1072 in the circuit 978.

Here the values of the capacitors 920, 930, 940, and 950 typically range from 1 pF to 40 pF using commercially available variable capacitors. Provided the capacitance can be added across the terminals of the inductor $L_1$ 1010, if $L_1$ 1010 has an inductance of approximately 240 nH then the circuit will tune and match from approximately 40 MHz to approximately 200 MHz. For frequencies in this range, approximately means plus or minus twenty (20) percent. Except for high frequency operation (i.e., above 200 MHz), the circuit in FIG. 1 can be balanced electrically when $C_1$ 920 is bigger than $C_2$ 930. Here the sum of the impedances to ground 1070 for $C_1$ 920 and $C_2$ 930 is different than that of $C_3$ 930 to ground 1072 resulting in an unbalanced circuit, i.e. $L_1 C_1$ (1010, 940) is balanced by symmetry. For inductance in this range, approximately means plus or minus ten (10) percent.

Figure 2:
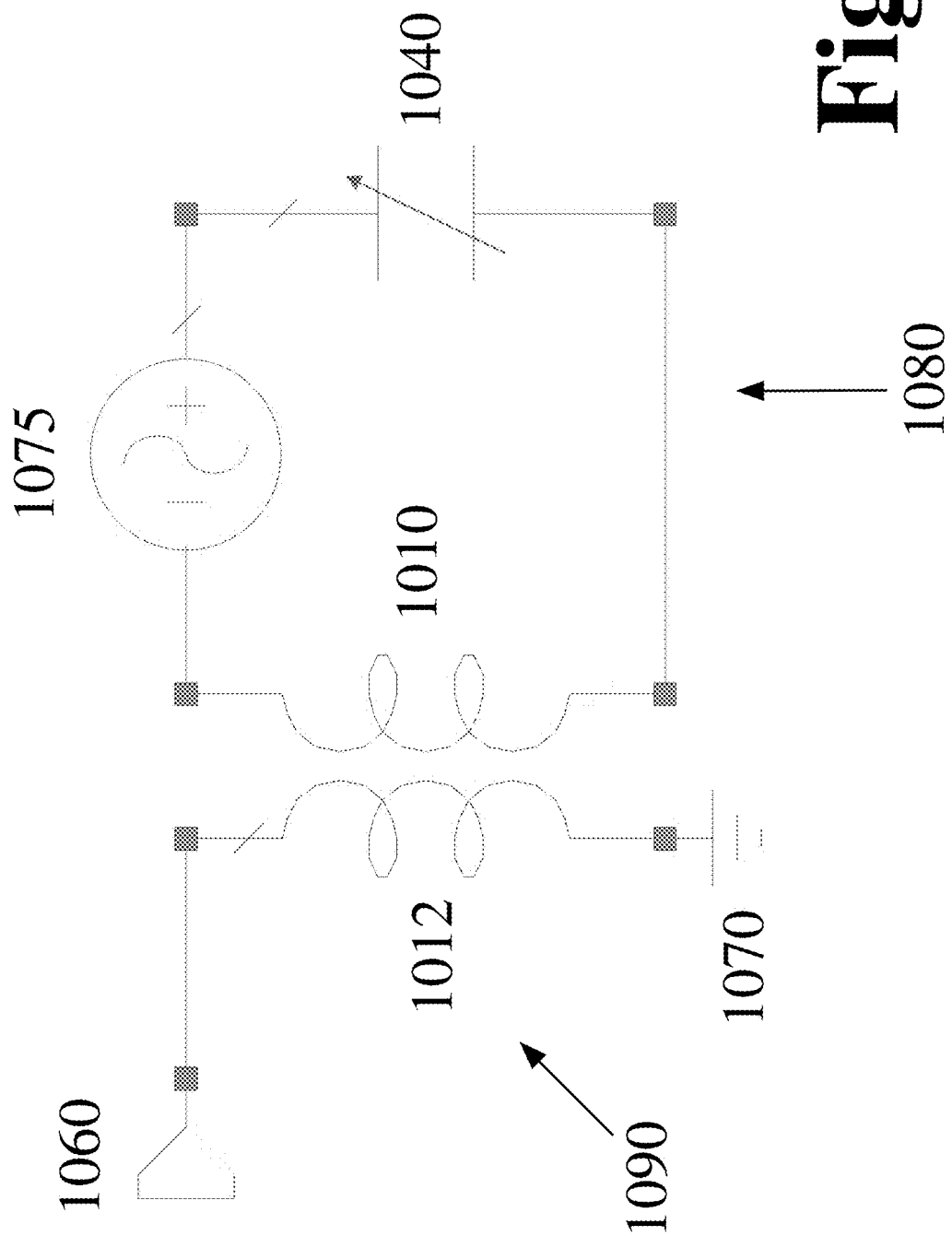
FIG. 2 shows inductive coupling for a circuit including inductive and capacitive elements (i.e., an LC circuit), as known in the literature.

The circuit in FIG. 2 illustrates the use of inductive coupling of the sample coil 1010 of the primary circuit 1080 to the coupling loop 1012 of the secondary circuit 1090 is matched to 50 Ohm of the impedance port 1060. The inductive coupling between the primary circuit 1080 and the secondary circuit 1090 shown in FIG. 2 form a circuit which functions in an equivalent manner to the capacitive coupling circuit 1078 shown in FIG. 1. In FIG. 2, $C_1$ 1040 is used to tune the circuits 1080, 1090. The coupling of $L_2$ 1012 to $L_1$ 1010 is used to match the circuits 1080, 1090 in an iterative process (e.g., adjust $C_1$ 1040 and then vary the distance between 1010 and 1012 to adjust K and then adjust $C_1$ 1040). In this circuit 1080, 1090 the inductive reactance of $L_2$ 1012 is tuned out by making $C_1$ 1040 slightly capacitive from the resonance condition ($\omega^2 L_1 C_1 = 1$).

For FIG. 2 the reactance of $L_2$ 1012 is tuned out by varying the coupling constant K between $L_1$ 1010 and $L_2$ 1012, see Equation 1. In Equation 1, the mutual inductance ($M_{a,b}$) is proportional to the overlap of the two $B_1$ fields of the inductors $L_a$ and $L_b$, which can be varied by changing the physical separation between the two (2) coils.

$$M_{a,b} = K * \sqrt{L_a * L_b} \tag{1}$$

One of the major issues with inductively coupled circuits is how the match is achieved. In FIG. 2 this is done by varying the K value for the circuit in conjunction with changing the value of $C_1$ 1040. For most applications this is problematic because it requires the coupling loop to be physically moved. In many cases this is difficult because in addition to the loop itself, the coaxial cable must also move in some capacity along with the coupling loop.

For the inductively coupled circuits discussed herein, the electrical balance of the circuit is not an issue due to the symmetry of the circuit. However, it is important to note that it is not necessary to have a symmetric circuit in order to match a resonant mode in a circuit to a 50 Ohm coaxial cable using a variable inductor without varying K over a broad frequency range.

Figure 3:
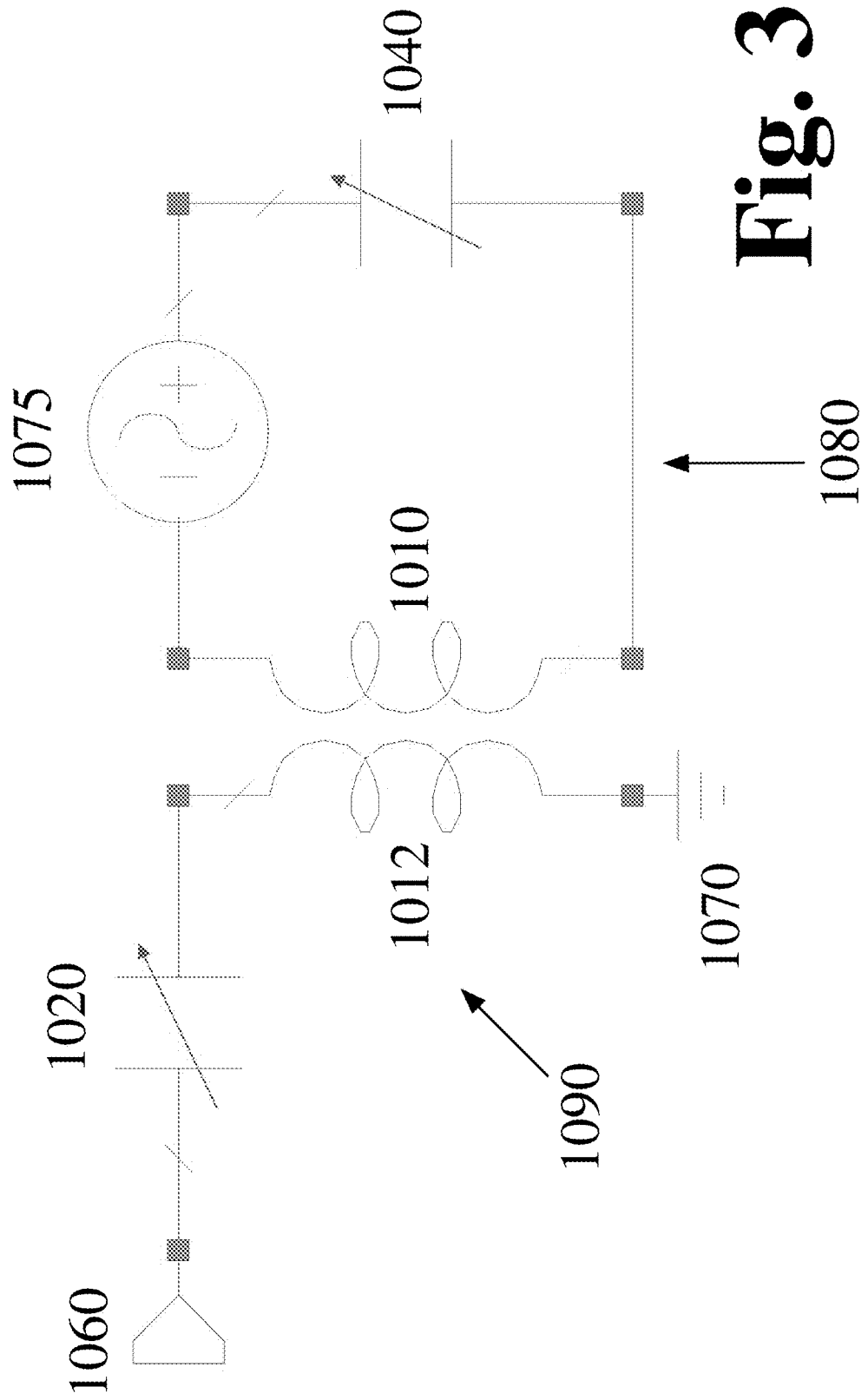
FIG. 3 shows inductive coupling for a LC circuit in which the circuit is matched to 50 Ohm by varying $C_2$ when $C_1$ and $L_1$ are resonated in series, as known in the literature.

FIG. 3 shows a method of matching inductively coupled circuits 1080, 1090, where the sample coil 1010 and variable capacitor 1040 of the primary circuit 1080 is at series resonance so that the only resistance in the primary circuit 1080 remains. The coupling loop reactance ($L_2$ 1012) is tuned out with the variable capacitor 1020 so that the secondary circuit 1090 is matched to 50 Ohm of the impedance port 1060 as outlined by P. L. Kuhns, M. J. Lizak, S. H. Lee, M. S. Conradi, "Inductive Coupling and Tuning in NMR Probes; Applications", J. Magn. Reson. (1988) 78, 69-76. Note that the reactance, $L_2\omega$ (where $\omega$ is the Larmor frequency) is typically on the order of approximately 200 Ohm so that the combination of K and Q reduces the resistance to 50 Ohm of the impedance port 1060, as shown in Equation 2 (adapted from Equation (5) of Kuhns, Id). For reactance in this range, approximately means plus or minus ten (10) percent.

$$R_{in} = \frac{V_2}{I_2} = K^2 Q_1 (\omega L_2) \tag{2}$$

A third method of matching inductively coupling a primary circuit 1080 with a secondary circuit 1090 is shown in FIG. 4. In FIG. 4 the reactance of $L_1\omega$ is tuned out by varying $C_1$ 1040 and $L_3$ 1014 such that the primary circuit 1080 and the secondary circuit 1090 is matched to 50 Ohm of the impedance port 1060. Typically, $C_1$ 1040 is slightly more capacitive than the resonance condition and hence by varying $L_3$ 1014 the circuit reactance can be reduced to zero while matching the circuit to 50 Ohm of the impedance port 1060.

In trying to access the best of these inductive matching circuits to match to 50 Ohm several parameters need to be examined. Firstly, there is the efficiency of the matching method and whether the energy loss from the primary inductor 1010 is excessive. A second issue becomes important when one tries to do NMR experiments that rely on the circuit being balanced. One of the most obvious advantages of inductive coupling is that the circuit is inherently balanced as explained by B. Taber, A. Zens, "Using Magnetic Coupling to Improve the $^1H/^2H$ Double Tuned Circuit", J. Magn. Reson. (2015) 259 114-120, which is incorporated by reference in its entirety and for all purposes. This is not to say that capacitive coupling can't be balanced, but effort is needed to make sure that a capacitively coupled circuit such as that shown in FIG. 1 is balanced.

Figure 5A:
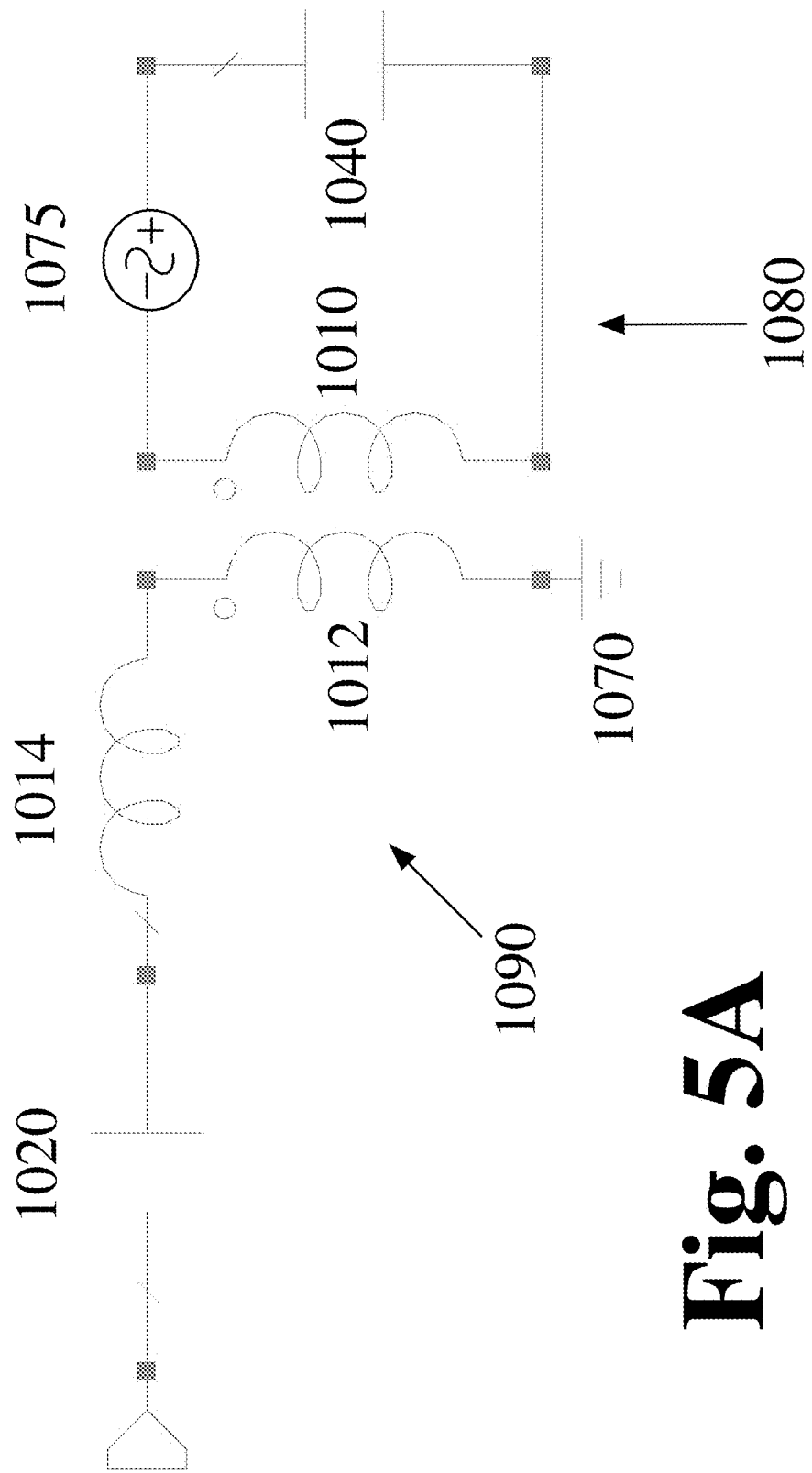
FIG. 5A shows an inductively coupled circuit with an inductor, a capacitor and an additional capacitor.
Figure 5B:
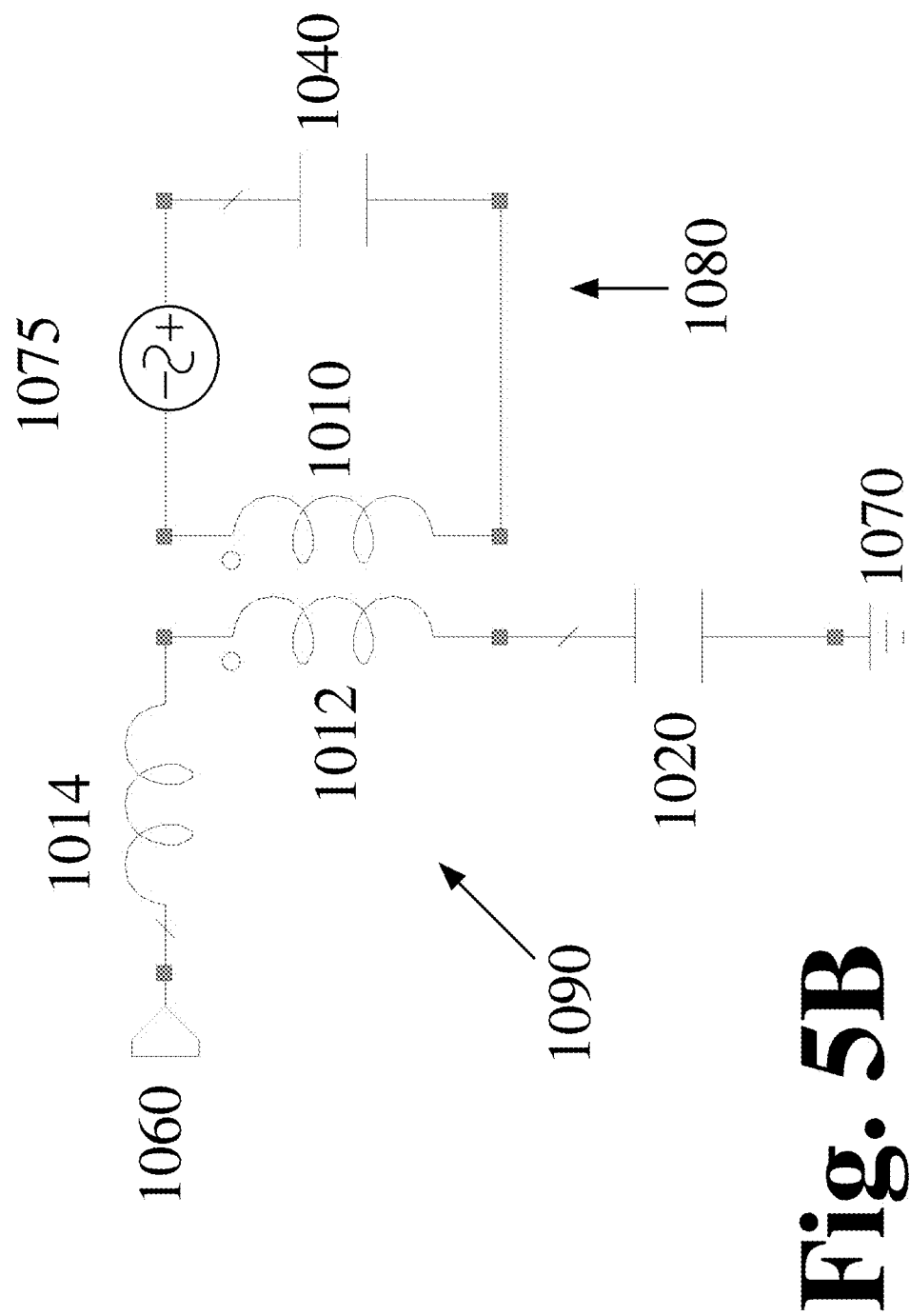
FIG. 5B shows an inductively coupled circuit with an inductor, a capacitor and an additional capacitor.
Figure 5C:
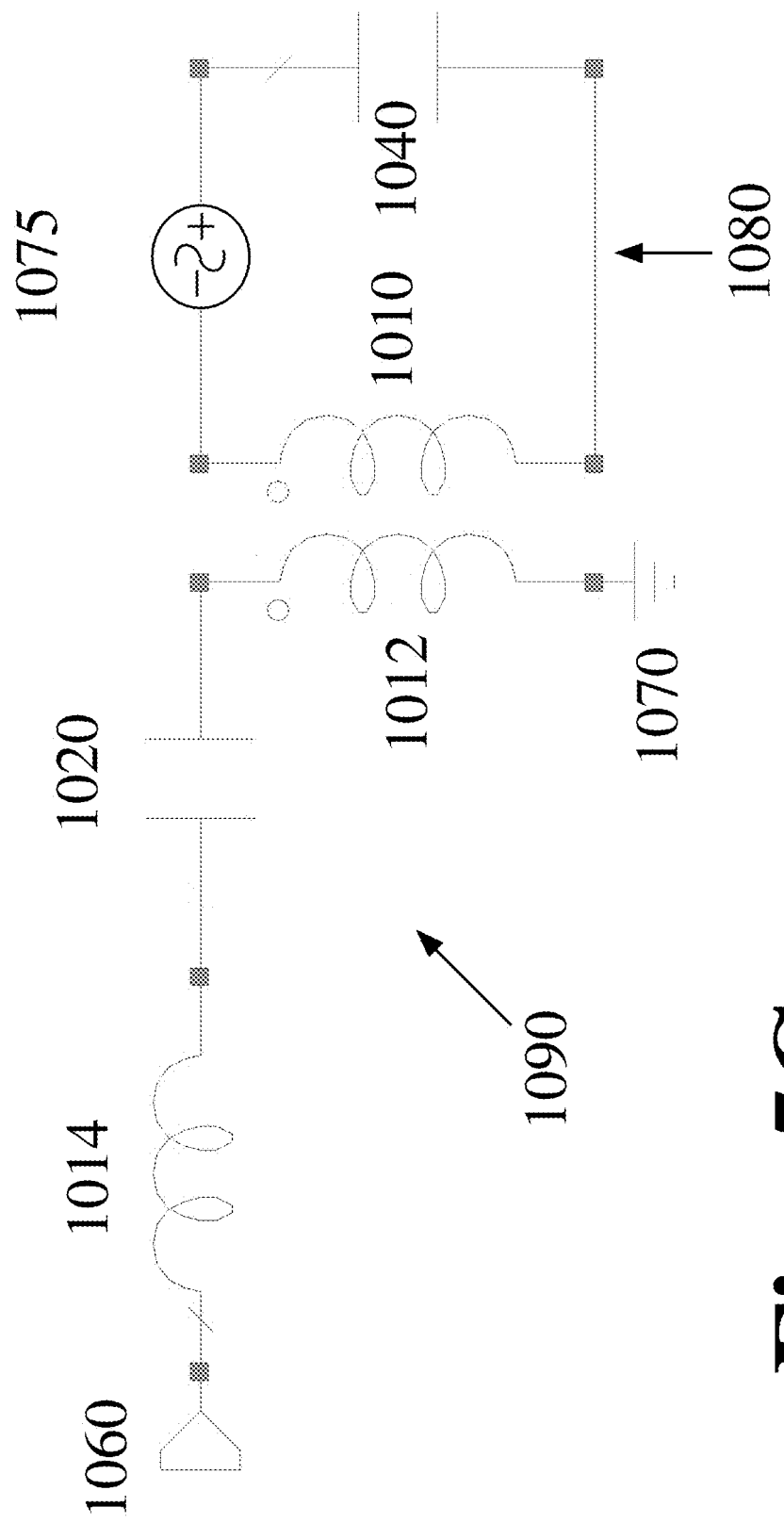
FIG. 5C shows an inductively coupled circuit with an inductor, a capacitor and an additional capacitor.

While in FIG. 5A-FIG. 5C the capacitor 1020 and the inductor 1014 in the circuits are not shown as a variable capacitor or a variable inductor, a person of ordinary skill in the art would understand that in order to match the secondary circuit 1090 to 50 Ohm, one or both capacitor 1020 and inductor 1014 can be a variable capacitor or a variable inductor. From the standpoint of energy efficiency, methods of inductive coupling using the capacitor 1020 and the inductor 1014 are similar. FIG. 5A-FIG. 5C show some possible set-ups for two inductively coupled circuits (i.e., circuits where a secondary circuit 1090 is inductively coupled with a primary circuit 1080) and tuned using either an inductor 1014 or a capacitor 1020, respectively. In FIG. 5A-FIG. 5C the primary circuit 1080 includes a 240 nH sample inductor 1010, a power supply 1075, and a capacitor 1040. At a frequency of 120 MHz, the circuit 1090 is matched to 50 Ohm of the impedance port 1060. The secondary circuit 1090 shown in FIG. 5A utilizes an inductor 1014 to match to 50 Ohm of the impedance port 1060 which is more efficient than the secondary circuit 1090 shown in FIG. 5B which utilizes a capacitor 1020 to match to 50 Ohm of impedance port 1060. In FIG. 5C either the inductor 1014 or the capacitor 1020 can be used to match to 50 Ohm of impedance port 1060.

Figure 6B:
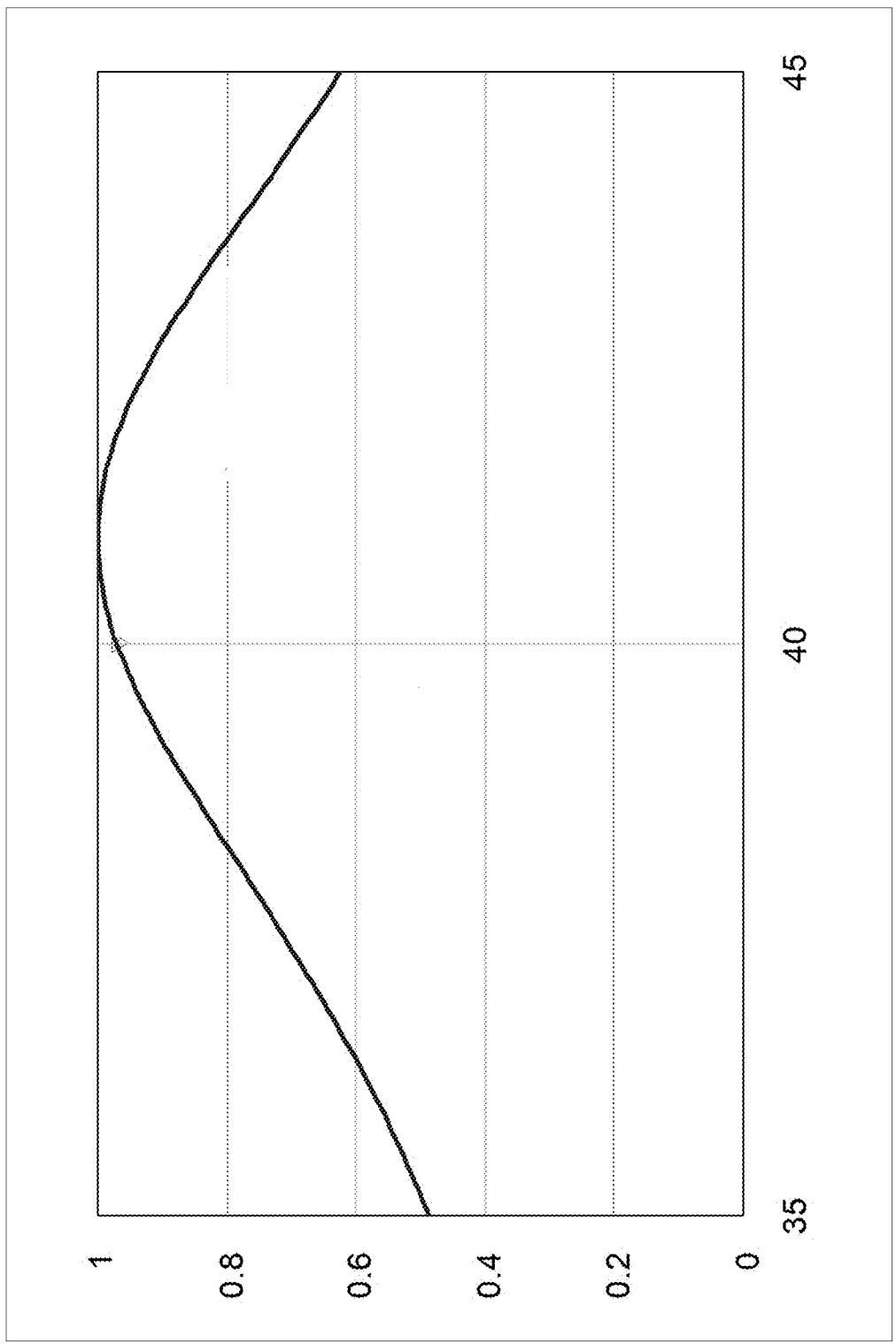
FIG. 6B shows the Circuit Fill Factor (CFF) for the circuit shown in FIG. 3 tuned and matched to the 40 MHz resonance.
Figure 7A:
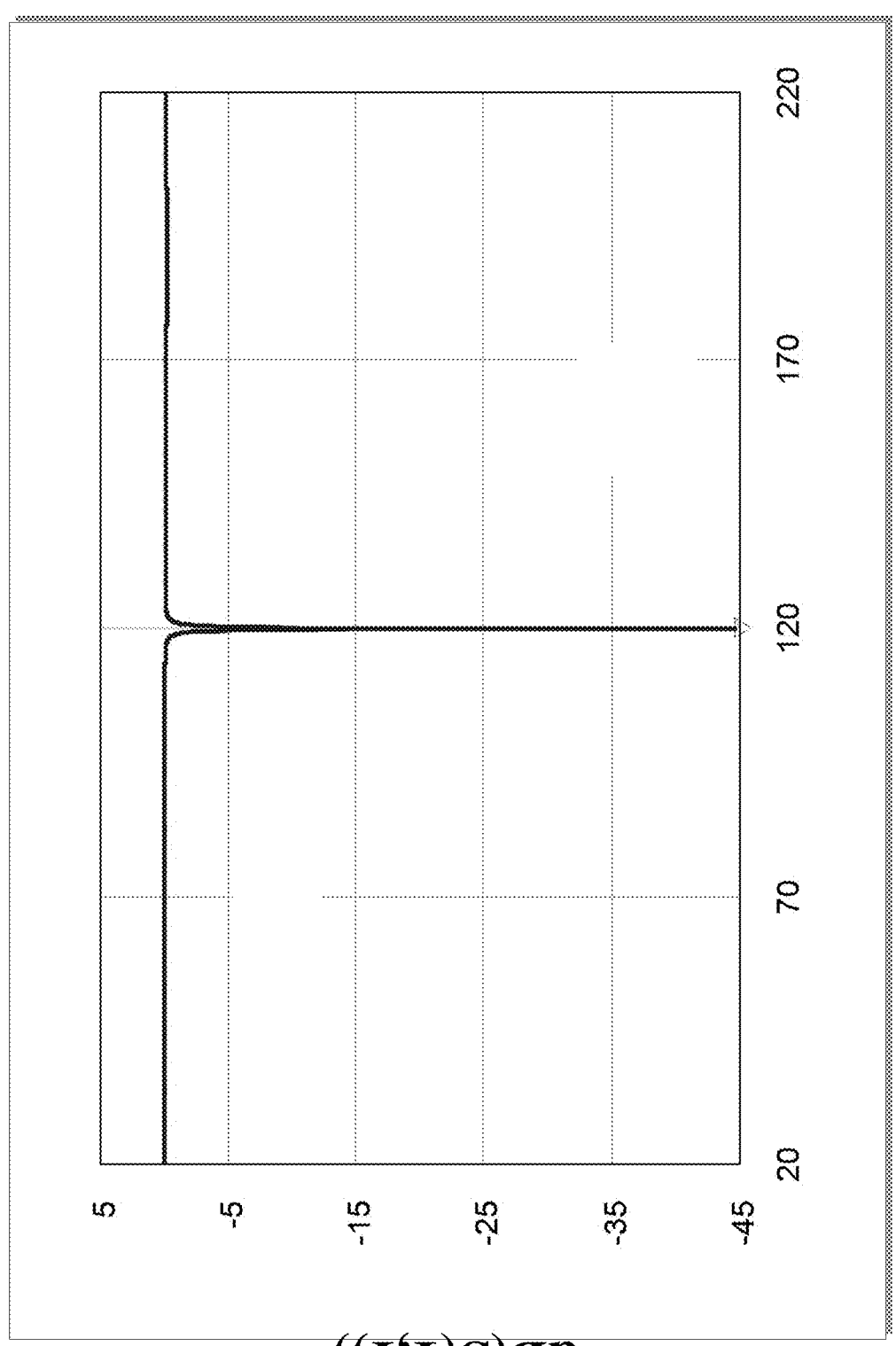
FIG. 7A shows the resonance dB(|S(1,1)|) plot for a primary inductor shown in FIG. 3 tuned and matched to 120 MHz.
Figure 7B:
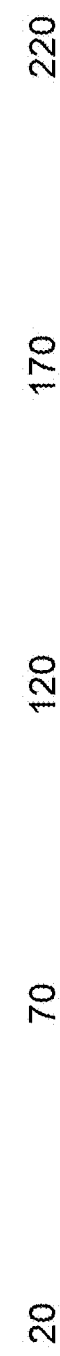
FIG. 7B shows the CFF for the circuit shown in FIG. 3 tuned and matched to the 120 MHz resonance.
Figure 8A:
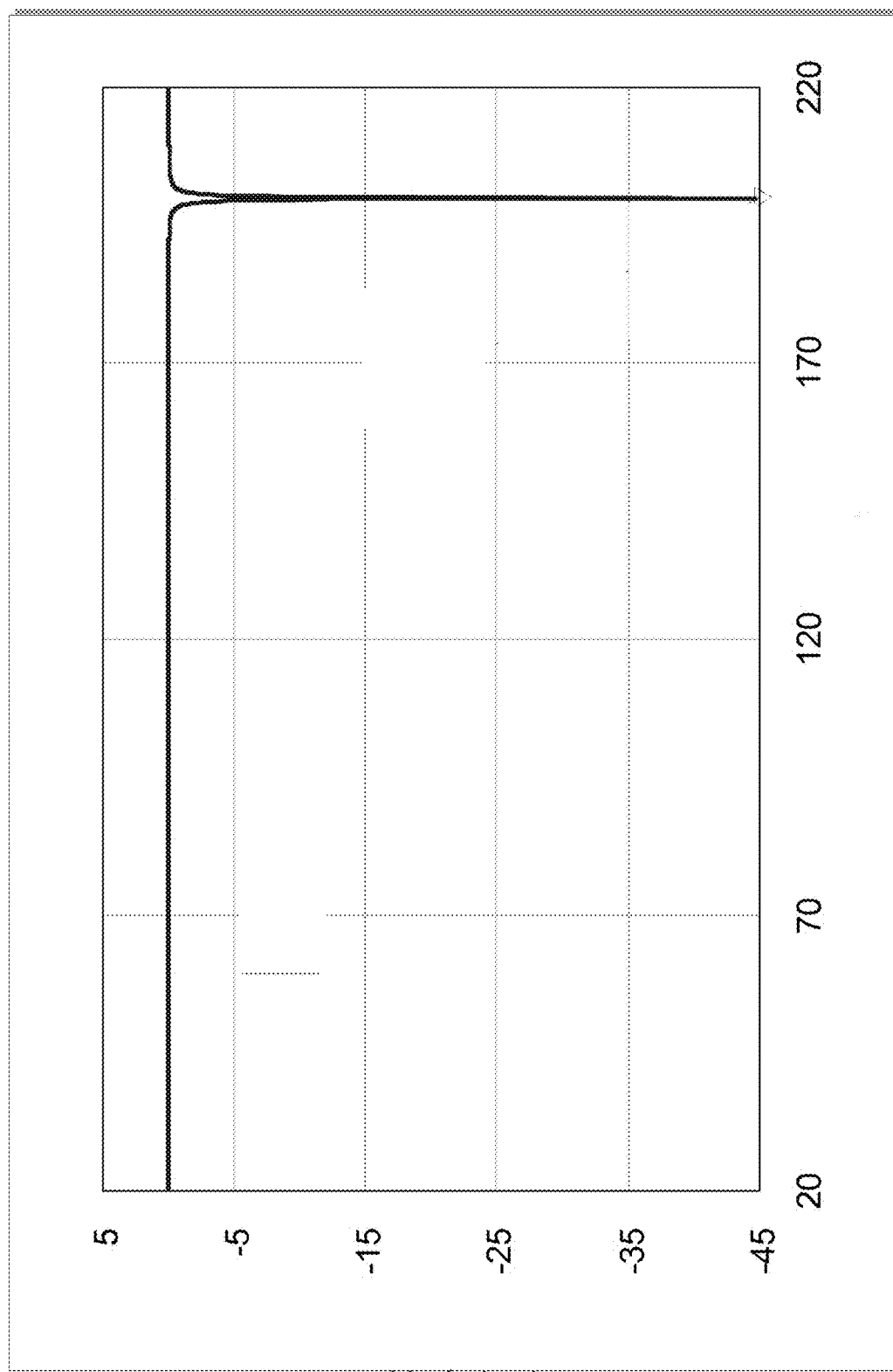
FIG. 8A shows the resonance dB(|S(1,1)|) plot for a primary inductor shown in FIG. 3 tuned and matched to 200 MHz.
Figure 8B:
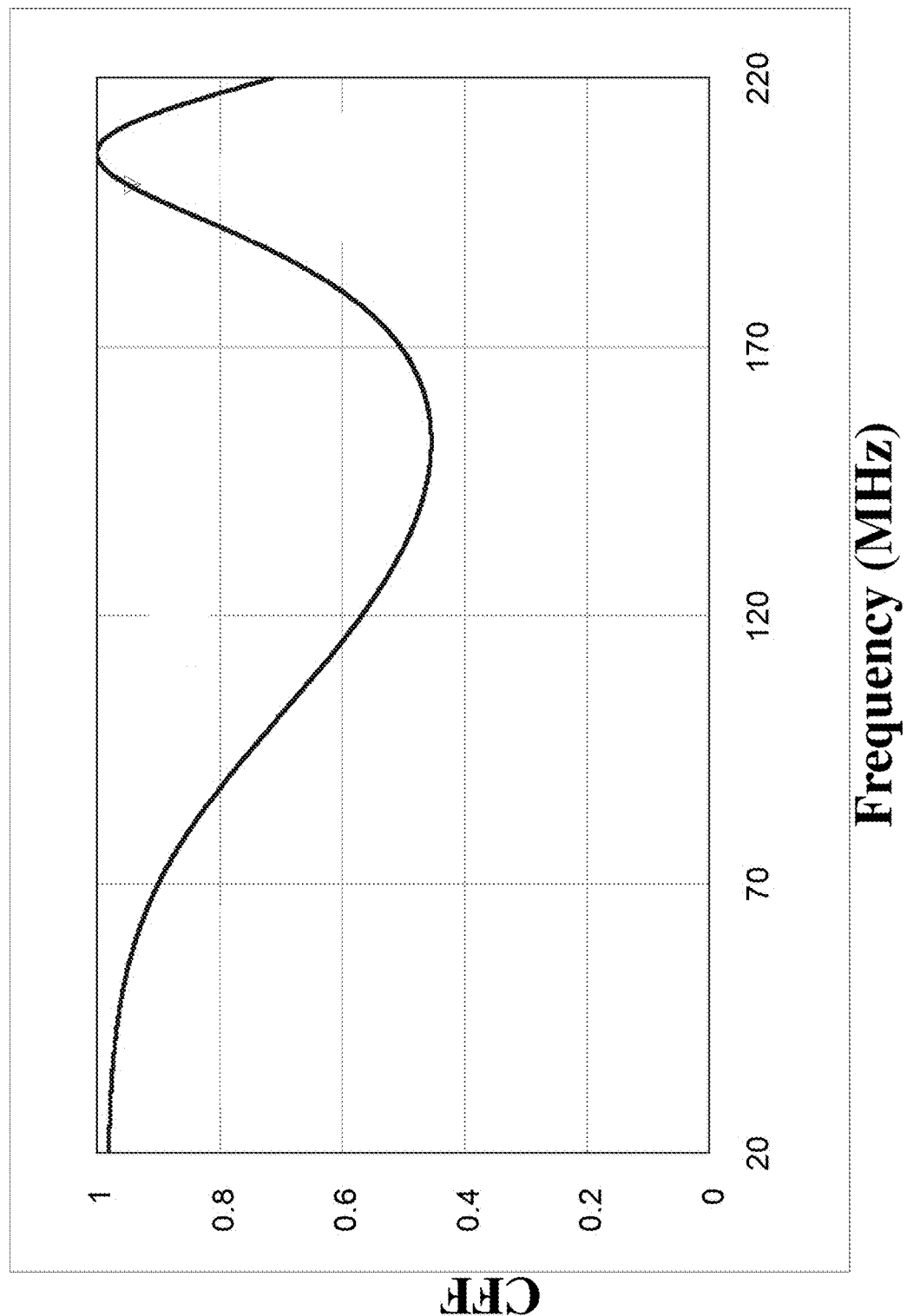
FIG. 8B shows the CFF for the circuit shown in FIG. 3 tuned and matched to the 200 MHz resonance.

FIG. 6A shows the primary inductor 1010 for the circuit shown in FIG. 3 tuned and matched for a frequency of 40 MHz, where $C_2$ 1020 is equal to 61.93 pF and a minimum is observed of −45 dB at a frequency of approximately 45 MHz. FIG. 7A shows the primary inductor 1010 for the circuit shown in FIG. 3 tuned and matched for a frequency of 120 MHz, where $C_2$ 1020 is equal to 6.075 pF and a minimum is observed of −45 dB at a frequency of approximately 120 MHz. FIG. 8A shows the primary inductor 1010 for the circuit shown in FIG. 3 tuned and matched for a frequency of 200 MHz, where $C_2$ 1020 is equal to 2.305 pF and a minimum is observed of −45 dB at a frequency of approximately 200 MHz. FIG. 6B, FIG. 7B and FIG. 8B show the CFF of 0.9705, 0.9539 and 0.9475 respectively, for the circuits shown in FIG. 6A, FIG. 7A and FIG. 8A, respectively. It was found that without changing the K value it was not possible to tune and match continuously over the frequency range from approximately 40 MHz to approximately 200 MHz. For frequencies in this range, approximately means plus or minus twenty (20) percent. The CFF for the 200 MHz condition dropped considerably from unity, thus indicating that the coupling loop is extracting energy from the sample inductor.

Figure 9A:
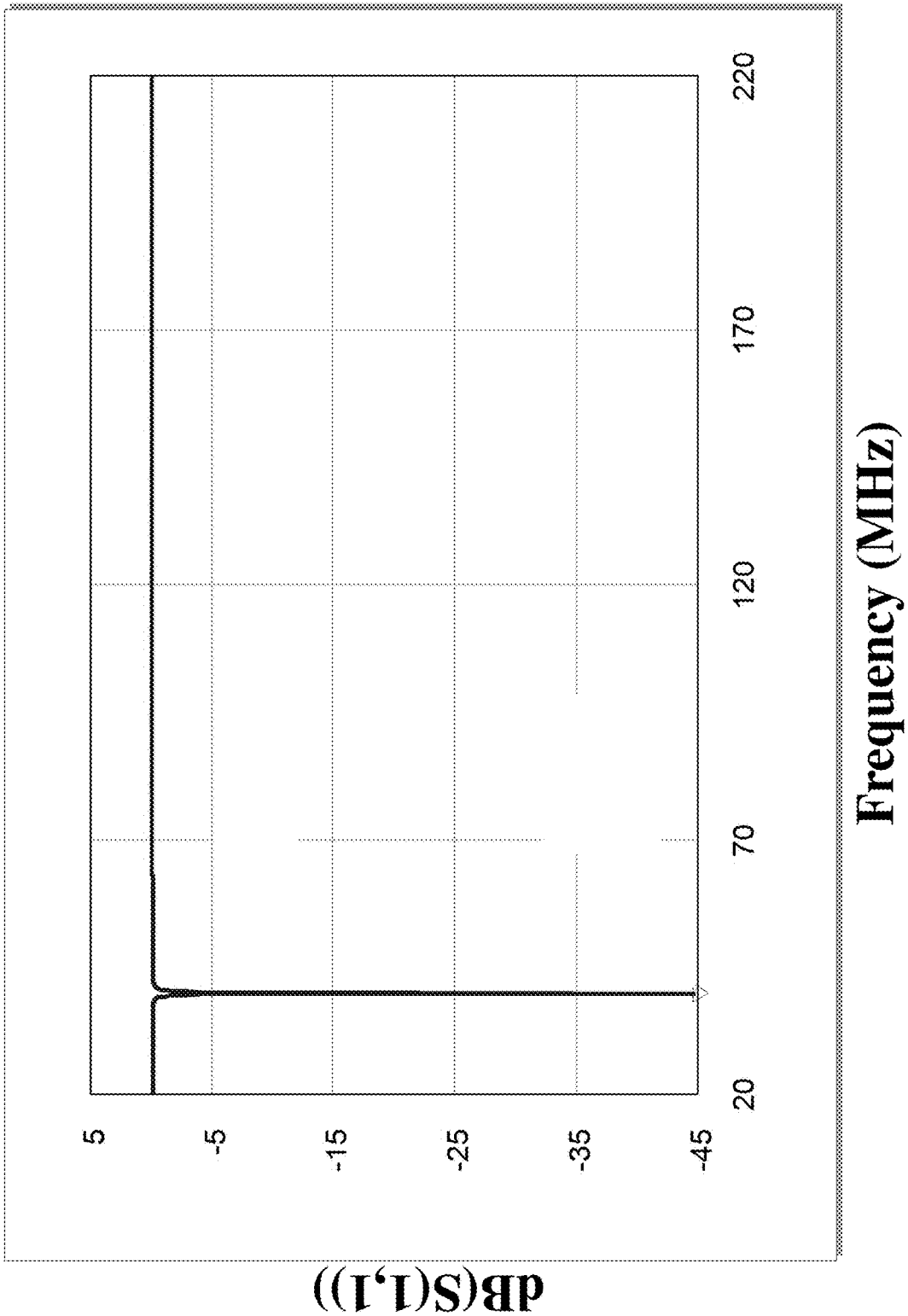
FIG. 9A shows the resonance dB(|S(1,1)|) plot for a primary inductor shown in FIG. 4 tuned and matched to 40 MHz, according to an embodiment of the present invention.
Figure 9B:
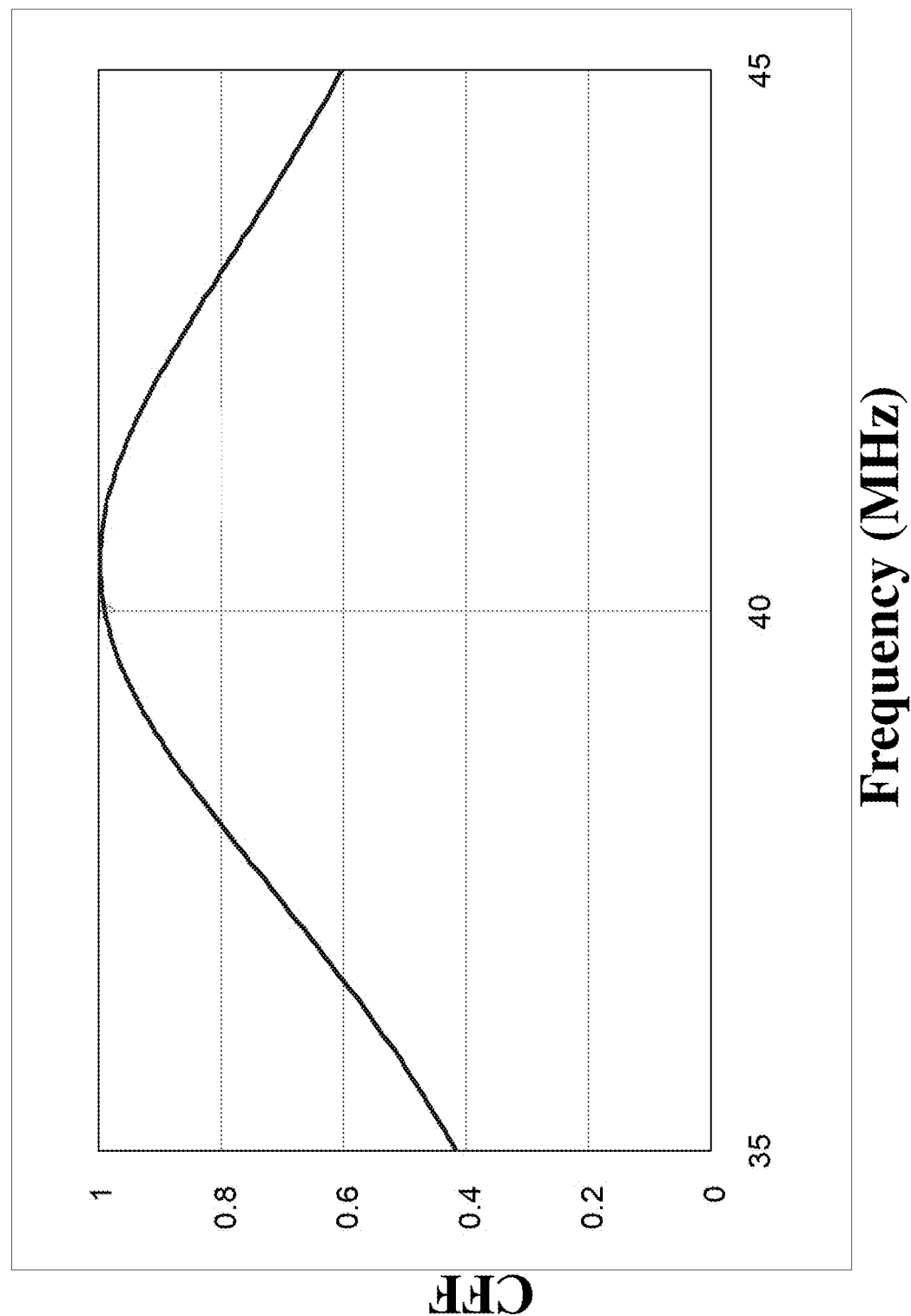
FIG. 9B shows the CFF for the circuit shown in FIG. 4 tuned and matched to the 40 MHz resonance, according to an embodiment of the present invention.
Figure 10A:
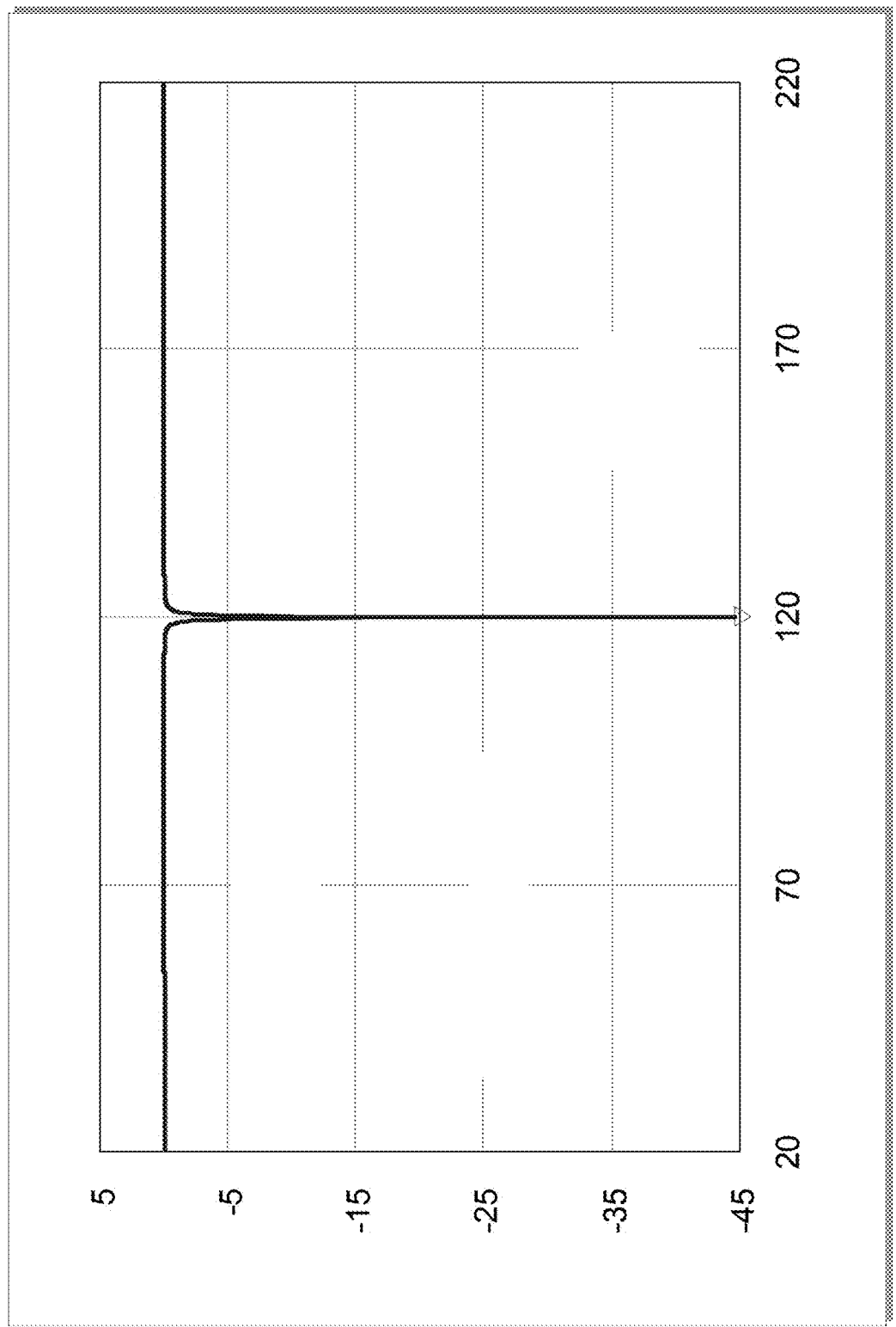
FIG. 10A shows the resonance dB(|S(1,1)|) plot for a primary inductor shown in FIG. 4 tuned and matched to 120 MHz, according to an embodiment of the present invention.
Figure 10B:
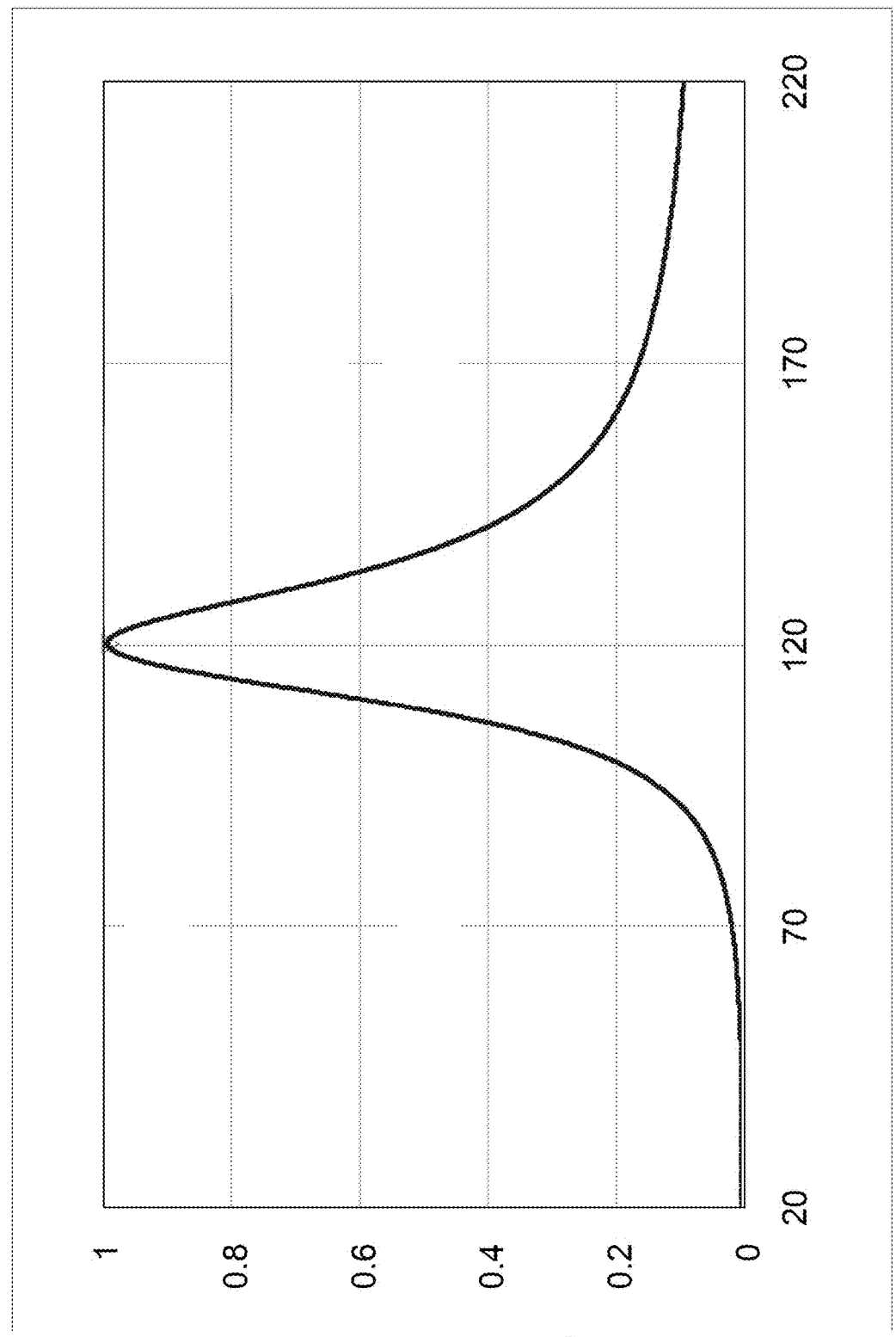
FIG. 10B shows the CFF for the circuit shown in FIG. 4 tuned and matched to the 120 MHz resonance, according to an embodiment of the present invention.
Figure 11A:
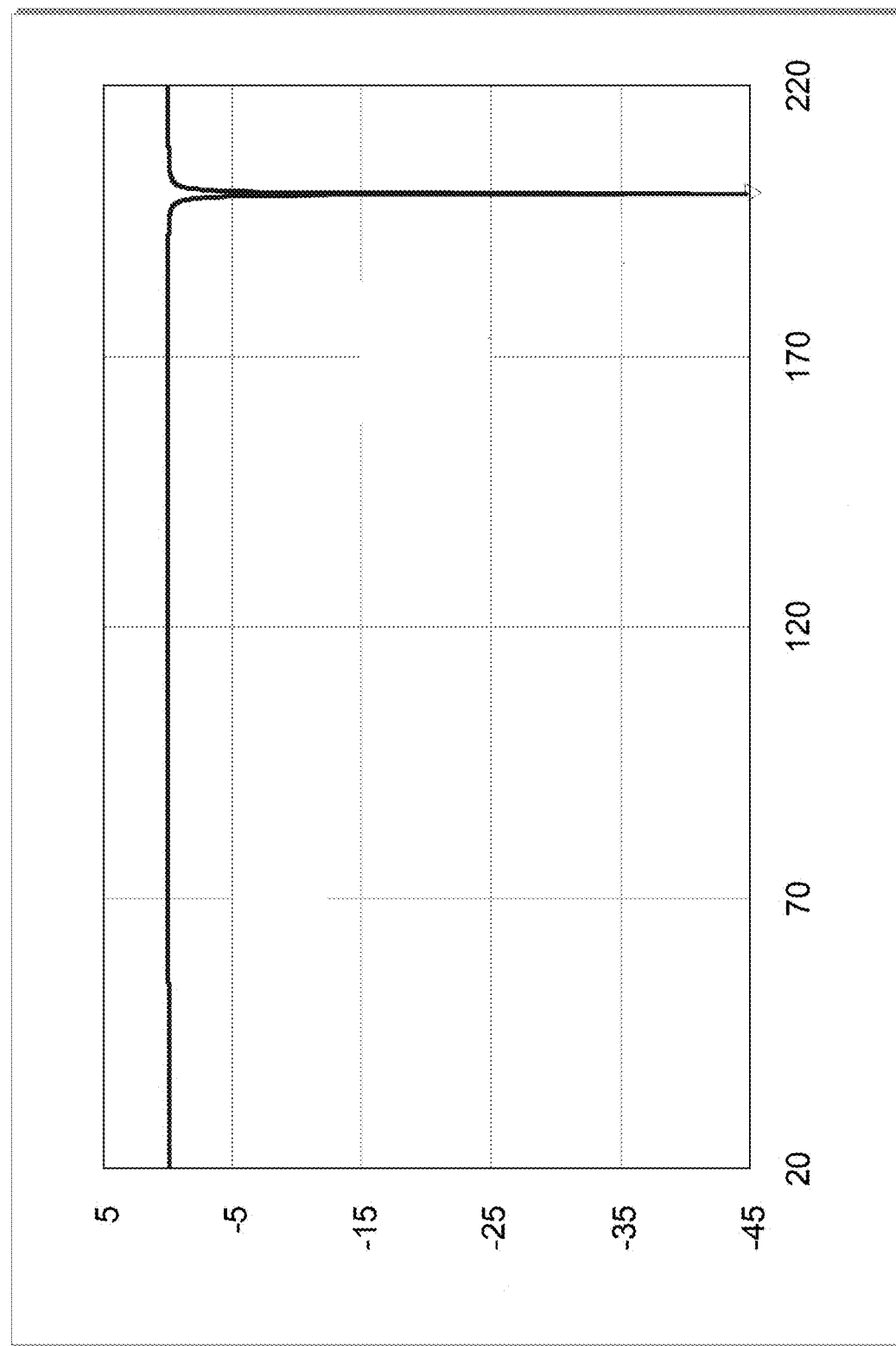
FIG. 11A shows the resonance dB(|S(1,1)|) plot for a primary inductor shown in FIG. 4 tuned and matched to 200 MHz, according to an embodiment of the present invention.
Figure 11B:
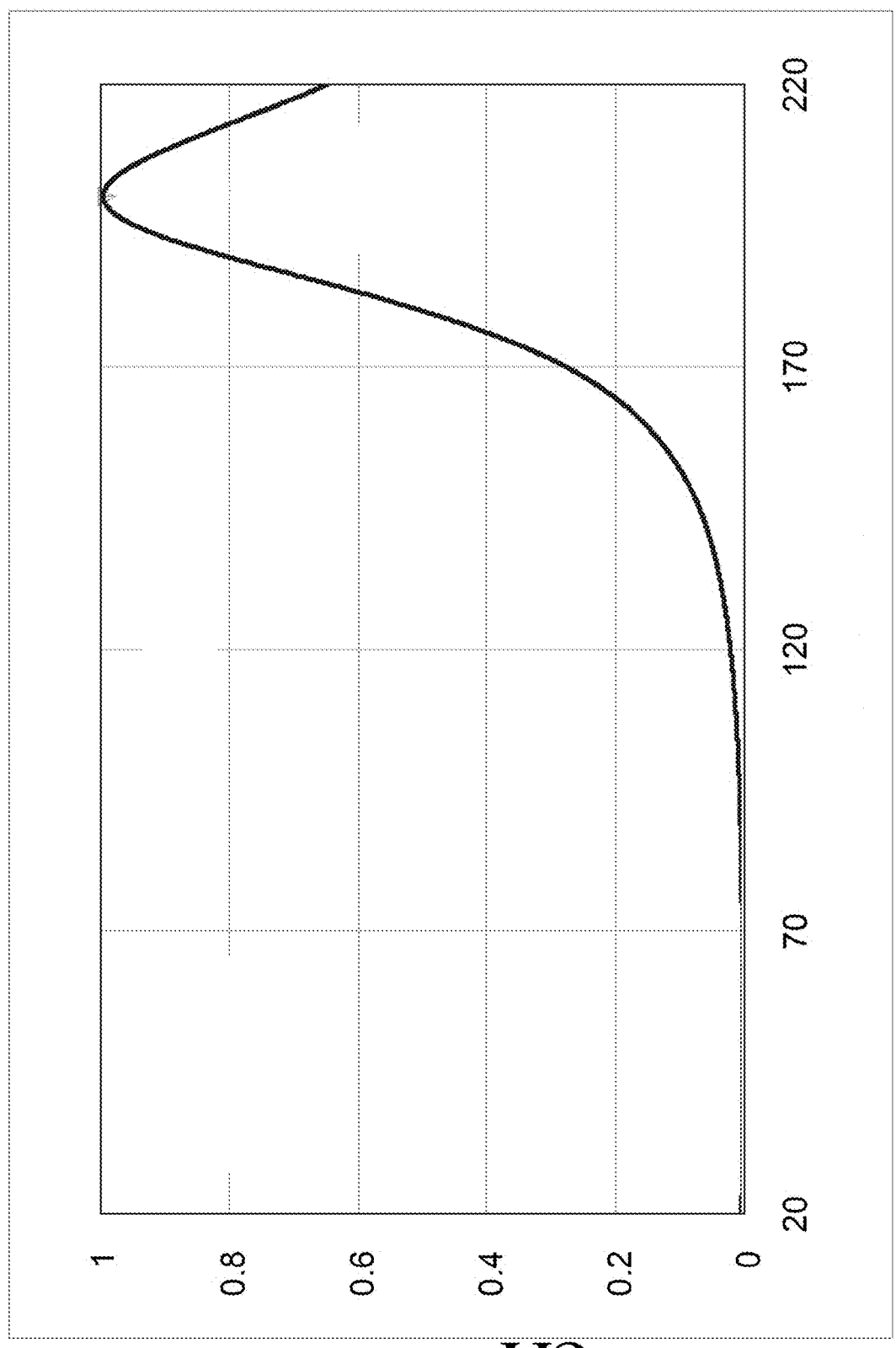
FIG. 11B shows the CFF for the circuit shown in FIG. 4 tuned and matched to the 200 MHz resonance, according to an embodiment of the present invention.

FIG. 9A shows the primary inductor 1010 for the circuit shown in FIG. 4 tuned and matched for a frequency of 40 MHz, where $L_3$ 1014 is equal to 17.08 nH and a minimum is observed of −45 dB at a frequency of approximately 40 MHz. FIG. 10A shows the primary inductor 1010 for the circuit shown in FIG. 4 tuned and matched for a frequency of 120 MHz, where $L_3$ 1014 is equal to 50.45 nH and a minimum is observed of −45 dB at a frequency of approximately 120 MHz. FIG. 11A shows the primary inductor 1010 for the circuit shown in FIG. 4 tuned and matched to 200 MHz, where $L_3$ 1014 is equal to 17.35.20 nH and where a minimum is observed of −45 dB at a frequency of approximately 200 MHz. FIG. 9A, FIG. 10A and FIG. 11A show tune and matching using inductive coupling without having to change the value of K, according to an embodiment of the present invention. FIG. 9B, FIG. 10B and FIG. 11B show the CFF of 0.9903, 0.9943 and 0.9958 respectively, for the circuits shown in FIG. 9A, FIG. 10A and FIG. 11A, respectively.

A comparison of FIG. 8B and FIG. 11B shows that the maximum CFF for the circuit shown in FIG. 3 is observed at approximately 209 MHz (the CFF at 200 MHz is 0.9475), whereas the maximum CFF (0.9958) for the circuit shown in FIG. 4 is observed at approximately 200 MHz. A comparison of FIG. 7B and FIG. 10B shows that the maximum CFF for the circuit shown in FIG. 3 is observed at approximately 125 MHz (the CFF at 120 MHz is 0.9539), whereas the maximum CFF (0.9943) for the circuit shown in FIG. 4 is observed at approximately 120 MHz. That is, the circuit matched capacitively (through $C_1$ 1020) is not as efficient as the circuit matched inductively (through $L_3$ 1014) for the same coupling constant (0.134).

In an unexpected result, use of the variable inductor inductive match circuit required little adjustment of $L_3$ 1014 in the circuit. It was possible to match the circuit to 50 Ohm with a 20 db return loss over the approximately 40 MHz to approximately 120 MHz frequency range without needing to adjust $L_3$ 1014. For frequencies in this range, approximately means plus or minus twenty (20) percent. However, by adjusting $L_3$ a greater than 40 db return loss was achieved for 40 MHz, 120 MHz and 200 MHz.

FIG. 6B and FIG. 9B show the CFF plots for the circuits shown in FIG. 3 and FIG. 4, respectively. The inductively coupled secondary circuit 1090 and the coupling loop 1012 used in FIG. 3 and FIG. 4 (as per B. Taber, A. Zens, "Using Magnetic Coupling to Improve the $^1H/^2H$ Double Tuned Circuit", J. Magn. Reson. (2015) 259, 114-120) contain very little energy, i.e. 99% of all the energy remains in the primary circuit 1080 and the sample coil 1010. Hence the coupling loop 1012 really doesn't contribute to the energy profile of the inductively coupled circuits 1080, 1090. The loss of approximately 1% of energy here need not be considered a major issue considering the benefits of using inductive coupling. For energy loss in this range, approximately means plus or minus five (5) percent.

The tuning range of the variable capacitor 1020 and variable inductor 1014 inductive coupled circuits can also be examined (see Table 1). For example, in FIG. 6A-FIG. 8A the 240 nH inductor 1010 in the circuit shown in FIG. 3 is tuned and matched at frequencies between 40 MHz-200 MHz. While in FIG. 9A-FIG. 11A the 240 nH inductor 1010 in the circuit shown in FIG. 4 is tuned and matched at frequencies between 40 MHz-200 MHz.

For the circuit shown in FIG. 3 it was not possible to tune and match the circuit over the range of frequencies from 40 MHz to 200 MHz with a 40 db return loss without having to significantly adjust the K value of the circuit. Even if adjusting K was in practice feasible it adds another variable to the tune and match condition. In contrast, as shown in FIG. 9A-FIG. 11A it was possible to tune and match the 240 nH inductor from 40 MHz to 200 MHz using the variable inductor 1014 to inductive match circuit. Importantly, in the circuit shown in FIG. 4, only two (2) variables are used to match the secondary circuit ($C_1$ 1040 and $L_3$1014). In an embodiment of the invention, using a variable inductor to match the secondary circuit to 50 Ohm allows the sum of the capacitance in the primary circuit and secondary circuit to be between a lower limit of approximately 1 pF and an upper limit of approximately 10 pF. In an alternative embodiment of the invention, using a variable inductor to match the secondary circuit to 50 Ohm allows the sum of the capacitance in the primary circuit and secondary circuit to be between a lower limit of approximately 1 pF and an upper limit of approximately 100 pF. In an embodiment of the invention, inductively matching the secondary circuit allows the variable capacitor in the primary circuit to be limited to a capacitance between a lower limit of approximately 1 pF and an upper limit of approximately 10 pF. In an alternative embodiment of the invention, inductively matching the secondary circuit allows the variable capacitor in the primary circuit to be limited to a capacitance between a lower limit of approximately 1 pF and an upper limit of approximately 100 pF. In this range, approximately means plus or minus ten (10) percent.

Unexpectedly, only inductively coupling with a variable inductor can be used when trying to tune and match over a large frequency range, i.e. over 160 MHz. The variable inductor inductive tune and match circuit (shown in FIG. 4) requires only two (2) variables to accomplish this goal, and does not involve adjusting the K value to achieve a good match condition. Furthermore, the variable inductor inductive coupling method appears to be more robust in that it requires little adjustment of the third inductor ($L_3$1014).

It is also noted that most uses of the capacitor inductive coupling circuit do not limit the number of variables being used, i.e. $C_1$, $C_2$ and K are often varied simultaneously to achieve the 50 Ohm matching condition. Unexpectedly, by limiting the number of components varied to two (2), it was found that the K value did not require adjustment. From a practical standpoint the two (2) variables are $L_3$ 1014 and $C_1$ 1040 for the circuit shown in FIG. 4.

It should be recognized that variations of the circuit shown in FIG. 4 can exist without fundamentally changing the nature of the circuit and its broadband tune and match capability using just two (2) variables. FIG. 5A, FIG. 5B and FIG. 5C show three (3) such circuits, all of which can work in a similar manner to the circuit shown in FIG. 4. The basic variable inductor inductive match circuit is not altered by the addition of a non-variable capacitor. The added capacitor simply assists in tuning out the inductive reactance of the circuit. The presence of an additional capacitor simply moves the tune range of the circuit so that the value of $L_3$1014 doesn't need to be adjusted In the circuits presented in B. Taber, A. Zens, "Using Magnetic Coupling to Improve the $^1$H/$^2$H Double Tuned Circuit", J. Magn. Reson., (2015) 259, 114-120 it should be noted that using a ground connection is problematic due the inherent structure of NMR probe bodies which in most cases have ground points at different levels of the probe body. Basically, unless these ground points are all at exactly the same potential ground loops are generated. Essentially these ground loops act as extra inductors in the probe circuit. In the circuit shown in FIG. 4 the primary circuit 1080 has no ground points in order to enforce the circuit symmetry.

As shown in Table 1A the capacitance of the capacitor $C_2$ 1020 in the circuit shown in FIG. 3 is increasing exponentially as the frequency is reduced to 40 MHz. This means that for the circuit shown in FIG. 3, the capacitor $C_2$1020 must be adjusted to over 60 pF in order to keep the coupling constant (K) of 0.135 at a loop inductance of 120 nH. In contrast, for the circuit shown in FIG. 4, the inductance of the inductor $L_3$1014 is approximately 34±16 nH over the range 40 MHz-200 MHz. Unexpectedly, for the circuit shown in FIG. 3 at a frequency of 40 MHz matching the resonance to 50 Ohm requires an extremely high capacitor (>60 pF). Unexpectedly, for the circuit shown in FIG. 4 at a frequency of 40 MHz matching the resonance to 50 Ohm requires a reasonable inductance (approximately 17 nH). Accordingly, using the variable inductor of the circuit shown in FIG. 4 to match the circuit to the 50 Ohm coaxial cable has unexpected benefits compared with using a variable capacitor of the circuit shown in FIG. 3.

OTHER EMBODIMENTS

A method to detect a Nuclear Magnetic Resonance (NMR) mode including, introducing a sample into a NMR probe comprising a primary circuit (1080) and a secondary circuit (1090), where the primary circuit (1080) comprises a sample coil (1010), a Radio Frequency (RF) pulse generator (1075), and a first variable capacitor (1040), where the secondary circuit (1090) comprises a coupling loop (1012), a variable inductor (1014) and an impedance port (1060), introducing the NMR probe into a magnetic field, exciting the sample with the Radio Frequency (RF) pulse generator (1075), inductively coupling the coupling loop (1012) to the sample coil (1010), adjusting the first variable capacitor (1040) and the variable inductor (1014) to match impedance of the impedance port (1060) to a required impedance, and detecting a NMR mode of a nuclei of the sample.

A method to detect a Nuclear Magnetic Resonance (NMR) mode including, introducing a sample into a NMR probe comprising a primary circuit (1080) and a secondary circuit (1090), where the primary circuit (1080) comprises a sample coil (1010), a Radio Frequency (RF) pulse generator (1075), and a first variable capacitor (1040), where the secondary circuit (1090) comprises a coupling loop (1012), a variable inductor (1014) and an impedance port (1060), introducing the NMR probe into a magnetic field, exciting the sample with the Radio Frequency (RF) pulse generator (1075), inductively coupling the coupling loop (1012) to the sample coil (1010), adjusting the first variable capacitor (1040) and the variable inductor (1014) to match impedance of the impedance port (1060) to a required impedance, and detecting a NMR mode of a nuclei of the sample, where the primary circuit is symmetric if a plane of reflection splits components equally either side of the plane of reflection and passes midway through the sample coil.

A method to detect a Nuclear Magnetic Resonance (NMR) mode including, introducing a sample into a NMR probe comprising a primary circuit (1080) and a secondary circuit (1090), where the primary circuit (1080) comprises a sample coil (1010), a Radio Frequency (RF) pulse generator (1075), and a first variable capacitor (1040), where the secondary circuit (1090) comprises a coupling loop (1012), a variable inductor (1014) and an impedance port (1060), introducing the NMR probe into a magnetic field, exciting the sample with the Radio Frequency (RF) pulse generator (1075), inductively coupling the coupling loop (1012) to the sample coil (1010), adjusting the first variable capacitor (1040) and the variable inductor (1014) to match impedance of the impedance port (1060) to a required impedance, and detecting a NMR mode of a nuclei of the sample, where the primary circuit is symmetric if the inductive components that comprise the primary circuit with the exception of the sample coil have a mirrored arrangement.

A high resolution Nuclear Magnetic Resonance (NMR) probe including a primary circuit comprising a sample coil (L1), a Radio Frequency (RF) pulse generator and a first variable capacitor, where the primary circuit is a symmetric circuit, and a secondary circuit comprising a coupling loop (L2), a variable inductor and an impedance port, where a coupling constant (K) between the sample coil (L1) and the coupling loop (L2) is given by K=M/(L1L2), where M is a mutual inductance between L1 and L2, where the first variable capacitor and the variable inductor are adapted to match the secondary circuit to a required impedance of the impedance port.

A high resolution Nuclear Magnetic Resonance (NMR) probe including a primary circuit comprising a sample coil (L1), a Radio Frequency (RF) pulse generator and a first variable capacitor, where the primary circuit is a symmetric circuit, and a secondary circuit comprising a coupling loop (L2), a variable inductor and an impedance port, where a coupling constant (K) between the sample coil (L1) and the coupling loop (L2) is given by K=M/√(L1L2), where M is a mutual inductance between L1 and L2, where the first variable capacitor and the variable inductor are adapted to match the secondary circuit to a required impedance of the impedance port, the secondary circuit further comprising a second capacitor.

A high resolution Nuclear Magnetic Resonance (NMR) probe including a primary circuit comprising a sample coil (L1), a Radio Frequency (RF) pulse generator and a first variable capacitor, where the primary circuit is a symmetric circuit, and a secondary circuit comprising a coupling loop (L2), a variable inductor and an impedance port, where a coupling constant (K) between the sample coil (L1) and the coupling loop (L2) is given by K=M/√(L1L2), where M is a mutual inductance between L1 and L2, where the first variable capacitor and the variable inductor are adapted to match the secondary circuit to a required impedance of the impedance port, the secondary circuit further comprising a second capacitor, where the second capacitor is a variable capacitor.

TABLE 1A

Comparison of CFF at 40 MHz, 120 MHz and 200 MHz frequencies for a coupling constant (K) of 0.135 for the circuit shown in FIG. 3.

| Frequency | 40 MHz | 120 MHz | 200 MHz |
|---|---|---|---|
| Sample Inductance | 240 nH | 240 nH | 240 nH |
| Quality Factor Q | 178.8 | 309.8 | 400 |
| Loop Inductance | 120 nH | 120 nH | 120 nH |
| Capacitance of $C_2$ 1020 | 61.93 pF | 6.075 pF | 2.305 pF |
| Resonance Capacitance of $C_1$ 1040 | 65.63 pF | 7.248 pF | 2.604 pF |
| CFF | 0.9705 | 0.9539 | 0.9475 |

TABLE 1B

Comparison of CFF at 40 MHz, 120 MHz and 200 MHz frequencies for a coupling constant (K) of 0.135 for the circuit shown in FIG. 4.

| Frequency | 40 MHz | 120 MHz | 200 MHz |
|---|---|---|---|
| Sample Inductance | 240 nH | 240 nH | 240 nH |
| Quality Factor Q | 178.8 | 309.8 | 400 |
| Loop Inductance | 120 nH | 120 nH | 120 nH |
| Inductuctance of $L_3$ 1014 | 17.08 nH | 50.45 nH | 35.20 nH |
| Resonance Capacitance of $C_1$ 1040 | 66.31 pF | 7.412 pF | 2.674 pF |
| CFF | 0.9904 | 0.9943 | 0.9977 |

TABLE 2

Comparison of CFF at 40 MHz, 120 MHz and 200 MHz frequencies for a coupling constant (K) of 0.125 for the circuit shown in FIG. 3.

| Frequency | 40 MHz | 120 MHz | 200 MHz |
|---|---|---|---|
| Sample Inductance | 240 nH | 240 nH | 240 nH |
| Quality Factor Q | 178.8 | 309.8 | 400 |
| Loop Inductance | 200 nH | 200 nH | 200 nH |
| Capacitance of $C_2$ 1020 | 2000 pF | 760 pF | 2.68 pF |
| Resonance Capacitance of $C_1$ 1040 | 65.63 pF | 7.248 pF | 2.604 pF |
| CFF | 0.9999 | 0.9997 | 0.9957 |

As shown in Table 2 the capacitance of the capacitor $C_2$ 1020 again increases exponentially as the frequency is reduced. This means that for the circuit shown in FIG. 3, the capacitance of capacitor $C_2$ 1020 in the circuit shown in FIG. 3 must be adjusted to over 760 pF in order to keep the coupling constant (K) of 0.125 at a loop inductance of 200 nH.

While the systems, methods, and devices have been illustrated by the described examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and devices provided herein. Additional advantages and modifications will readily be apparent to those skilled in the art. Therefore, the invention, in its broader aspects, is not limited to the specific details, the representative system, method or device, and illustrative examples shown and described. Accordingly, departures may be made from such details without departing from the spirit or scope of the applicant's general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents. In any multiply tuned circuit there must be at least as many modes as inductors.

What is claimed is:

1. A method to detect a Nuclear Magnetic Resonance (NMR) mode comprising:
    (a) introducing a sample into a NMR probe comprising a primary circuit and a secondary circuit (1090), where the primary circuit comprises a sample coil (L1), a Radio Frequency (RF) pulse generator, and a first variable capacitor, where the secondary circuit comprises a coupling loop (L2), a variable inductor and a single impedance port, where the coupling loop (L2) is in series with the variable inductor;
    (b) introducing the NMR probe into a magnetic field;
    (c) exciting the sample with the Radio Frequency (RF) pulse generator;
    (d) inductively coupling the coupling loop (L2) to the sample coil (L1);
    (e) adjusting the first variable capacitor and the variable inductor to match impedance of the single impedance port to a required impedance; and
    (f) detecting a NMR mode of a nuclei of the sample.

2. The method of claim 1, where the required impedance is 50 Ohm.

3. The method of claim 1, where the NMR mode of the nuclei is detected at a frequency between:
    a lower limit of approximately 40 MHz; and
    an upper limit of approximately 200 MHz.

4. The method of claim 1, where the nuclei is selected from the group consisting of $^1$H, $^2$H, $^{13}$C, $^{15}$N, $^{19}$F and $^{31}$P.

5. The method of claim 1, where a coupling constant (K) between the sample coil (L1) and coupling loop (L2) is given by $K=M/\sqrt{(L1L2)}$, where M is a mutual inductance between L1 and L2, where the first variable capacitor and the variable inductor are adjusted without adjusting the coupling constant (K).

6. The method of claim 1, where the the variable inductor is in series with the single impedance port.

7. The method of claim 1, where the secondary circuit is grounded, where the primary circuit is not grounded.

8. The method of claim 1, the secondary circuit further comprising a second capacitor.

9. The method of claim 8, where the second capacitor is a variable capacitor.

10. The method of claim 8, where a sum of a capacitance of the primary circuit and the secondary circuit is between:
    a lower limit of approximately 1 pF; and an upper limit of approximately 100 pF.

11. The method of claim 1, where a capacitance in the primary circuit is between:
    a lower limit of approximately 1 pF; and
    an upper limit of approximately 100 pF.

12. The method of claim 1, where the first variable capacitor has a capacitance between:
    a lower limit of approximately 1 pF; and
    an upper limit of approximately 100 pF.

13. A high resolution Nuclear Magnetic Resonance (NMR) probe comprising:
    (a) a primary circuit comprising a sample coil (L1), a Radio Frequency (RF) pulse generator and a first variable capacitor, where the primary circuit is a symmetric circuit; and
    (b) a secondary circuit comprising a coupling loop (L2), a variable inductor and a single impedance port, where the coupling loop is in series with the variable inductor, where a coupling constant (K) between the sample coil (L1) and the coupling loop (L2) is given by $K=M/\sqrt{(L1L2)}$, where M is a mutual inductance between L1 and L2, where the first variable capacitor and the variable inductor are adapted to match the secondary circuit to a required impedance of the single impedance port.

14. The high resolution NMR probe of claim 13, where the variable inductor is positioned between the single impedance port and the coupling loop (L2).

15. The high resolution NMR probe of claim 13, where the the variable inductor is in series with the single impedance port.

16. The high resolution NMR probe of claim 13, the required impedance is 50 Ohm.

17. The high resolution NMR probe of claim 13, the secondary circuit further comprising a second capacitor, where the second capacitor is a variable capacitor.

18. A method to match a Nuclear Magnetic Resonance (NMR) mode from a sample comprising:
   (a) introducing a sample in an NMR probe into a magnetic field, the NMR probe comprising:
   a primary circuit and a secondary circuit, where the primary circuit comprises a sample coil (L1), a Radio Frequency (RF) pulse generator and a first variable capacitor, where the secondary circuit comprises a coupling loop (L2), a variable inductor and a single impedance port, where the coupling loop is in series with the variable inductor, where the secondary circuit is grounded, where the primary circuit is not grounded; and
   (b) exciting the sample with the Radio Frequency (RF) pulse generator to generate a resonance, where the coupling loop (L2) is inductively coupling with the sample coil (L1);
   (c) adjusting the first variable capacitor and the variable inductor to match the secondary circuit to a required impedance of the single impedance port, where a coupling constant (K) between the sample coil (L1) and coupling loop (L2) is given by $K=M/\sqrt{(L1L2)}$, where M is a mutual inductance between L1 and L2, where the first variable capacitor and the variable inductor are adjusted without adjusting the coupling constant (K).

19. The method of claim 18, where a sum of a capacitance of the primary circuit and the secondary circuit is between: a lower limit of approximately 1 pF; and an upper limit of approximately 100 pF.

20. The method of claim 18, the secondary circuit further comprising a second capacitor, where the second capacitor is a variable capacitor.

* * * * *